United States Patent [19]
Morikawa et al.

[11] Patent Number: 5,689,124
[45] Date of Patent: Nov. 18, 1997

[54] SEMICONDUCTOR DEVICE

[75] Inventors: Yoji Morikawa; Takashi Aigo, both of Sagamihara, Japan

[73] Assignee: Nippon Steel Corporation, Tokyo, Japan

[21] Appl. No.: 453,397

[22] Filed: May 30, 1995

[30]　　Foreign Application Priority Data

| May 31, 1994 | [JP] | Japan | 6-119034 |
| May 31, 1994 | [JP] | Japan | 6-119035 |
| Aug. 19, 1994 | [JP] | Japan | 6-195591 |
| Dec. 7, 1994 | [JP] | Japan | 6-303928 |

[51] Int. Cl.$^6$ .............................. H01L 31/0328
[52] U.S. Cl. ................. 257/192; 257/200; 257/523; 257/183
[58] Field of Search .................. 257/183, 192, 257/194, 200, 503, 523

[56]　　　　References Cited

U.S. PATENT DOCUMENTS

| 4,925,810 | 5/1990 | Kano et al. | 257/200 |
| 5,272,365 | 12/1993 | Nakagawa | 257/195 |
| 5,286,985 | 2/1994 | Taddiken | 257/200 |
| 5,455,183 | 10/1995 | Swirhun | 437/24 |

*Primary Examiner*—Mark V. Prenty
*Attorney, Agent, or Firm*—Pollock, Vande Sande & Priddy

[57]　　　　ABSTRACT

A semiconductor device comprises a silicon substrate, at least one compound semiconductor layer formed on the silicon substrate and including a GaAs semiconductor layer for serving as a source/drain regions of at least one field-effect transistor (FET), an insulating layer selectively formed on at least one compound semiconductor layer; and first, second and third electrodes each having a first portion, formed on the GaAs semiconductor layer, and serving as one of gate/source/drain electrodes, respectively, of at least one FET, at least one of the first, second and third electrodes having a second portion formed on the insulating layer.

25 Claims, 23 Drawing Sheets

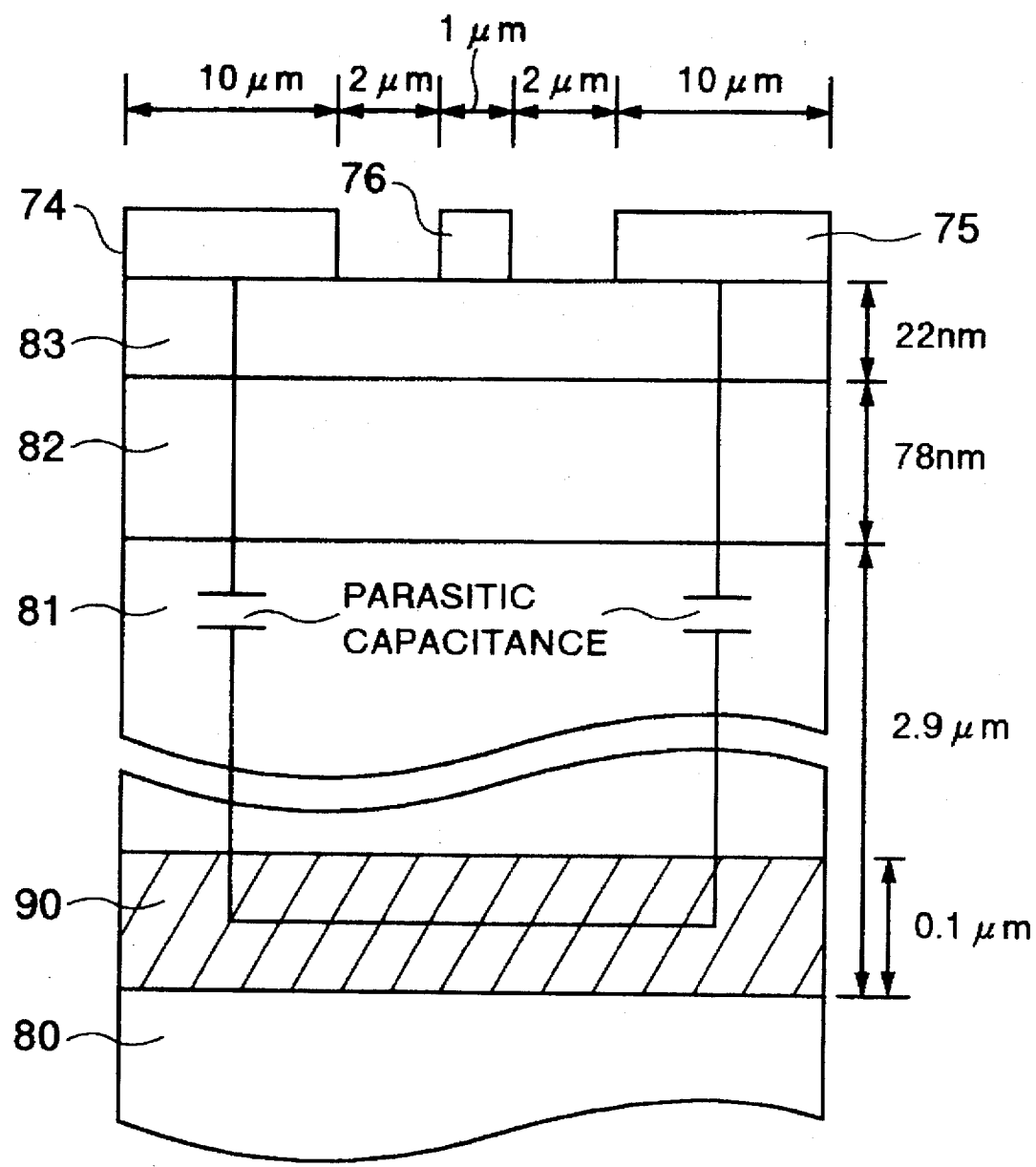

SEMICONDUCTOR DEVICE

BACKGROUND OF THE INVENTION

1. Field of the Invention

The present invention relates to a semiconductor device using a compound semiconductor. In particular, it relates to a semiconductor device in which an element such as a field-effect transistor (FET), or a high electron mobility transistor (HEMT) having superior characteristics in a high-frequency band, or with a high-speed digital signal, is formed on a compound semiconductor layer.

2. Description of the Related Art

A semiconductor device using a compound semiconductor, which is generally capable of operation at a higher speed and at a higher frequency than a device using a silicon semiconductor, has steadily extended applications.

In spite of the increasing demand for semiconductor devices using a compound semiconductor, the diameter of the bulk substrate with only a compound semiconductor is still 3 to 4 inches or, at most, about 5 inches. This fact, as compared with the silicon substrate having a diameter as large as 6 to 8 inches or 12 inches, maker mass production of semiconductor devices formed on the main substrate of a compound semiconductor difficult.

Under these circumstances, a compound semiconductor substrate is closely watched which has a compound semiconductor layer grown on a silicon substrate by epitaxy. Epitaxial growth of a compound semiconductor on a silicon substrate makes it possible to increase the diameter of the compound semiconductor substrate. Also, the substrate with a compound semiconductor layer formed on a silicon substrate is strong, and because of its high thermal conductivity, is superior in heat radiation from a semiconductor device formed on it.

FIG. 23 is a sectional view showing an example of a main substrate 10 formed with a compound semiconductor layer on a silicon substrate. A buffer layer 12 of GaAs or AlgaAs is formed by epitaxial growth on the silicon substrate 11, and further has formed thereon an active layer 13 of GaAs by epitaxial growth.

FIG. 24 is a plan view showing an example of a GaAs power MESFET fabricated using the substrate 10. In order to obtain the desired electrical value, the active layer 13 other than the portion thereof formed with the FET, is removed by mesa etching, leaving the particular portion without being etched. The etching depth of the portion of the active layer 13 removed by mesa etching extends to the entire active layer 13 and a part of the buffer layer 12. A part of the gate electrodes G, a part of the source electrode S and a part of the drain electrode D are located on the active layer 13. A gate pad G' connected to the gate electrodes G, another part of the source electrode S, and another part of the drain electrode D, are formed directly on the buffer layer 12 with the active layer 13 removed therefrom.

In a main substrate formed with a compound semiconductor layer of GaAs on a silicon substrate, however, the silicon becomes a donor source with respect to GaAs. Even when a high-resistance substrate is used as the silicon substrate, therefore, silicon atoms are diffused to the GaAs layer side of the interface between the silicon substrate and the GaAs layer at the time of epitaxial growth of GaAs on the silicon substrate. A low-resistance layer 20 thus undesirably forms, thereby posing the problem of a parasitic capacitance generated between each electrode and a wiring or a pad through the low-resistance layer 20.

FIG. 25 is a sectional view taken along line d—d in FIG. 24, showing the structure of the electrodes and the pad of a conventional device. The buffer layer 12 is normally several μm thick (distance B in FIG. 25), while the distance between the source electrode S and the gate pad G' is several tens of μm (distance A in FIG. 25). As a result, the capacitance between the source electrode S and the gate pad G' provides a capacitance as viewed through the low-resistance layer 20. In other words, the capacitance between the source electrode S and the gate pad G' is determined by the distance B between the low-resistance layer 20 and the gate pad G' through the buffer layer 12 rather than by the distance A, with the result that the parasitic capacitance is increased when using a main substrate having a compound semiconductor layer formed on this silicon substrate. The parasitic capacitance is also increased with other electrodes, wirings and pads as well as between the source electrode and the gate pad as shown in FIG. 25. This poses the problem of an adverse effect on the high-frequency characteristics of the device.

The parasitic capacitance of the bonding pad will be described in more detail.

FIG. 26 is a plan view showing a wiring and a bonding pad (hereinafter merely called "the pad") of a semiconductor device deposited with FETs using a main substrate having a compound semiconductor layer formed on a silicon substrate.

As shown in FIG. 26, the FET using a compound semiconductor is generally formed with a source (or a drain) pad 42 in such a position as to surround the gate pad 41.

The parasitic capacitance of each pad is affected by the circumferential length of the pad in addition to the pad area. In the case where a plurality of FETs (four FETs in the shown case) are integrated as shown in FIG. 26, provision of a pad for the source region 45, the drain region 46 and the gate electrode 44 of each FET would lengthen the circumferential length of each pad, and the resulting parasitic capacitance cannot be ignored. In view of this, a single large pad is used to reduce the circumferential length thereof as far as possible.

This semiconductor device, as shown in FIG. 27A, has a p-type GaAs layer 51 and a p-type AlGaAs layer 52 formed as a compound semiconductor layer on a p-type silicon substrate 50. Further, as shown in FIG. 27B, the FET portion is formed with an n-type GaAs 0.1 μm thick and $2 \times 10^{17}$ cm$^{-3}$ in impurities concentration providing a channel layer 53. The pads for the source, the drain and the gate are formed on the AlGaAs layer 52 with the channel layer 53 removed. FIG. 27A is a partial sectional view taken along line g—g of FIG. 26, and FIG. 27B is a partial sectional view taken in line h—h of FIG. 26.

With a main substrate formed with GaAs providing a compound semiconductor layer on a silicon substrate, however, the silicon provides a donor source for GaAs. Even when a high-resistance substrate is used as the silicon substrate, therefore, epitaxial growth of GaAs on the silicon substrate causes silicon atoms to be diffused to the GaAs layer 51 side of the interface between the silicon substrate 50 and the GaAs layer 51, with the result that a conductive layer 60 having a low resistance value is undesirably formed. As compared with the case using a bulk substrate of semi-insulating GaAs, the portions of the electrodes, the wiring, and the pads of the element formed on this substrate, develop a large parasitic capacitance with other electrodes, wiring and pads through the conductive layer 60. Since the conductive layer is formed over the entire surface of the substrate, the parasitic capacitance of the gate pad is connected with the parasitic capacitance of the adjacent source pad as shown by the equivalent circuit in FIG. 28. In other words, the parasitic capacitance generated for a pad assumes the same state as if a plurality of parasitic capacitances are electrostatically coupled by a conductive layer. Even when the inter-pad distance is increased, therefore, the parasitic capacitance assumes a very great value. Consequently, the high-frequency characteristics of the elements are adversely affected.

Now, explanation will be made in detail about the parasitic capacitance generated when an E-HEMT (enhancement-type high electron mobility transistor) is formed, in a conventional manner, on a main substrate (GaAs/Si substrate) with a compound semiconductor layer formed by epitaxial growth on a silicon substrate.

A sectional view of an E-HEMT is shown in FIG. 29. This E-HEMT is formed in the same manner as on a bulk GaAs substrate. On a p-type silicon substrate 80 of $3\times10^{12}/cm^3$ in impurities concentration, there are formed a p-type GaAs layer 81 having an impurities concentration of $1\times10^{15}/cm^3$ and a thickness of 2.9 μm, a p-type GaAs layer 82 having an impurities concentration of $5\times10^{14}/cm^3$ and a thickness of 78 nm thereon, and further an n-type AlGaAs layer (Al 0.3, Ga 0.7, As) 83 having an impurities concentration of $1\times10^{18}/cm^3$ and a thickness of 22 nm thereon, by epitaxial growth, respectively. A source electrode 74, a drain electrode 75 and a gate electrode 76 of the E-HEMT are formed on the n-type AlGaAs layer 83.

The conventional semiconductor device formed in this way with a main substrate having a GaAs layer formed on a silicon substrate uses the same technique as the semiconductor device formed on bulk GaAs. The source and drain electrodes etc., therefore, are formed taking only the size in terms of the contact area thereof into consideration so that no irregularities may develop in processes and that the contact resistance may not be increased.

With the main substrate having a GaAs layer formed on the silicon substrate 80, however, the silicon provides a donor source with respect to GaAs. Even when a high-resistance substrate is used as the silicon substrate, therefore, epitaxial growth of GaAs on the silicon substrate 80 causes silicon atoms to be diffused in the GaAs layer. As a consequence, an n-type GaAs layer having an impurities concentration of about $1\times10^{18}/cm^3$ and a thickness of about 0.1 μm is formed in the interface between the silicon substrate 80 and the GaAs layer 81, resulting in an interfacial conductive layer 90, low in resistance value, being undesirably generated.

As compared with the case of using a bulk substrate of GaAs having a semi-insulation characteristic, a large parasitic capacitance is generated between the electrodes through the interfacial conductive layer 90. This parasitic capacitance, as shown by the equivalent circuit of FIG. 30, assumes a state in which the conductive layer 90 connects the source electrode 74 and the drain electrode 75, thereby increasing the parasitic capacitance generation. This poses the problem of the characteristics of the element being adversely affected. Especially in the case where an inverter or the like is formed, the increased parasitic capacitance causes a transmission delay and makes it difficult to fabricate an inverter of satisfactory characteristics.

SUMMARY OF THE INVENTION

Accordingly, it is an object of the present invention to provide a semiconductor device having a superior high-frequency characteristics with a reduced parasitic capacitance using a main substrate having a compound semiconductor layer formed on a silicon substrate.

More specifically, the object of the invention is to provide a semiconductor device fabricated using a main substrate including a first semiconductor layer and a second semiconductor layer formed on the first semiconductor layer or, for example, a main substrate comprising a silicon substrate and a GaAs layer formed on the silicon substrate, in which the electrodes, the wiring and the pads develop only as small a parasitic capacitance as when they are formed on a semi-insulating GaAs bulk substrate.

In order to achieve the above-mentioned object, according to a first aspect of the invention, there is provided a semiconductor device comprising a main substrate including a silicon substrate and at least one compound semiconductor layer deposited on the silicon substrate, and a field-effect transistor formed on the compound semiconductor layer, wherein at least one of the gate/source/drain electrodes of the field-effect transistor, the wiring and the bonding pads connected to the electrodes is formed on the compound semiconductor layer through an insulating layer.

In a semiconductor device configured as described above, the electrodes, the wiring or the pads generating a parasitic capacitance is formed on a compound semiconductor layer through an insulating layer. Therefore, as compared with the conventional devices with the corresponding parts formed directly on a compound semiconductor layer, a smaller electric field is applied to the compound semiconductor layer. Also, provision of an insulating layer as an intermediary enlarges the distance between a low-resistance layer, which is formed in the interface of the silicon substrate and the compound semiconductor layer, and the electrodes, the wiring or the pads, thereby reducing the parasitic capacitance.

According to a second aspect of the invention, there is provided a semiconductor device comprising a main substrate including a first semiconductor layer, a second semiconductor layer deposited on the first semiconductor layer and a conductive layer generated by diffusion of atoms as impurities constituting the first semiconductor layer to the second semiconductor layer side of the interface between the first semiconductor layer and the second semiconductor layer, and an element formed on the substrate, wherein a high-resistance region higher in resistance than the conductive layer is formed in such a position as to surround the electrodes, the wiring and the bonding pads or any combination thereof configuring the element, the region thus isolating the conductive layer.

In a semiconductor device configured as described above, a conductive layer formed on the second semiconductor layer side of the interface between the first semiconductor layer and the second semiconductor layer is made partially high in resistance in such a manner as to surround at least one region of the electrodes, the wiring and the pads for which it is desired to reduce the parasitic capacitance. The portion surrounded by the high-resistance layer is thus electrically isolated to assume a potential independent of the other portion of the conductive layer. As a result, the isolated conductive layer is capable of varying its own potential to some degree following the potential variations caused in the electrodes, the wiring or the pads formed thereabove. In this way, the capacitance coupling is obviated which has so far existed with the other electrodes, wiring, or pads on a substrate through the conductive layer at a level of continuously equal potential as a common electrode, thereby reducing the parasitic capacitance.

Further, the inventors, for achieving the above-mentioned object, have discovered that the contact length of the source and drain electrodes has an optimum range in which the contact resistance of the source and drain electrodes poses no problem and the transmission delay or other characteristic deterioration due to capacitance between the source and drain electrodes can be ignored. The inventors have further introduced a generally-applicable equation defining the optimum range with the distance from the contact surface to the interfacial conductive layer as a function.

According to a third aspect of the invention, there is provided a semiconductor device comprising a main substrate including a semiconductor substrate, a compound semiconductor layer, which is formed on the semiconductor layer and different in composition from the semiconductor substrate, and an interfacial conductive layer formed in the hereto junction interface between the semiconductor substrate and the compound semiconductor layer, and a transistor element formed on the main substrate, wherein equations (1) and/or (2) below are satisfied $$1 \, \mu m \leq X \leq T \tag{1}$$

$$1 \, \mu m \leq Y \leq T \tag{2}$$

where X and Y are the length in the running direction of carriers at the portions of the source and drain electrodes of the transistor element which are in contact with the compound semiconductor layer respectively, and T is the shortest distance from the source and drain electrodes to the interfacial conductive layer.

A semiconductor device configured as described above comprises a main substrate including a semiconductor substrate, a compound semiconductor layer formed on the semiconductor substrate and different in composition from the semiconductor, and an interfacial conductive layer formed in the hetero junction interface between the semiconductor substrate and the compound semiconductor layer, that is, a main substrate including a GaAs layer formed on a silicon substrate, for example, and the semiconductor device further comprises a transistor formed on the main substrate. In this semiconductor device, in order to prevent the characteristic deterioration due to parasitic capacitance, the upper limit of the contact length of the source/drain electrode in the carrier running direction is set to the distance T from the contact to the interfacial conductive layer, and the lower limit to 1 μm to meet the relation specified by equation (1) and/or equation (2). The upper limit is set to the distance T from the contact to the interfacial conductive layer in order to prevent the characteristics deterioration by reducing the parasitic capacitance, and the lower limit is set to 1 μm in order to prevent variations of output voltage which otherwise might be caused by an increased contact resistance.

Consequently, a semiconductor device fabricated with a transistor such as various FET (field-effect transistor) or HEMT (high electron mobility transistor) has a superior characteristic comparable to a semiconductor device fabricated with a bulk GaAs substrate.

Also, a semiconductor device deposited with a plurality of compound semiconductor layers free of characteristics deterioration due to the parasitic capacitance can be fabricated by the use of the above-mentioned equations.

BRIEF DESCRIPTION OF THE DRAWINGS

FIG. 30 is a diagram showing an equivalent circuit for explaining the parasitic capacitance of a conventional semiconductor device.

DESCRIPTION OF THE PREFERRED EMBODIMENTS

First embodiment

A first embodiment of the invention will be described with reference to the accompanying drawings.

Figure 1:
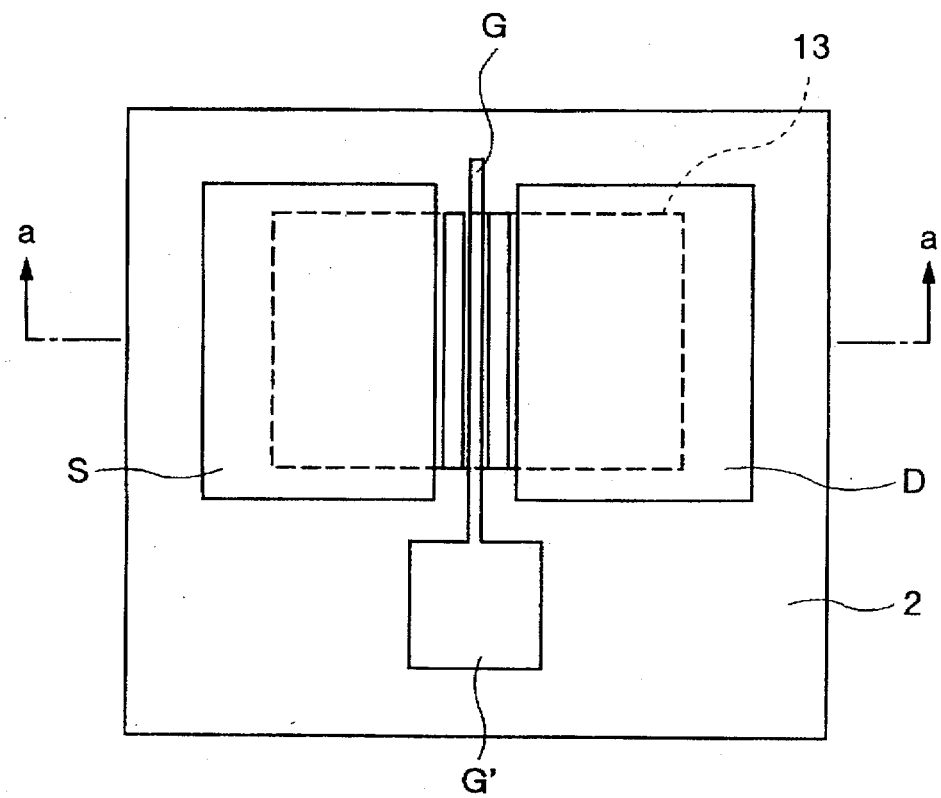
FIG. 1 is a plan view showing a semiconductor device according to a first embodiment of the invention.
Figure 2:
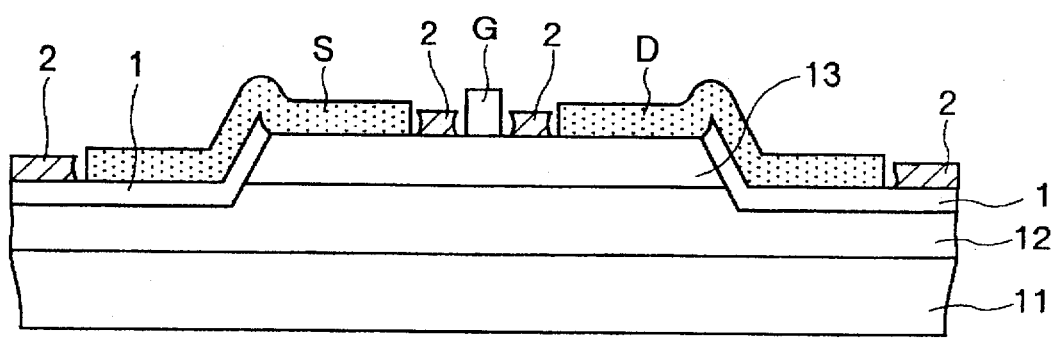
FIG. 2 is a sectional view taken along line a—a in FIG. 1 showing a sectional structure of a semiconductor device according to the first embodiment of the invention.

FIG. 1 is a plan view of a field-effect transistor (FET) formed on a compound semiconductor layer and of a semiconductor device according to the first embodiment of the invention, and FIG. 2 is a sectional view taken in line a—a along FIG. 1.

This field-effect transistor is a GaAs power MESFET comprising a silicon substrate 11, a buffer layer 12 of GaAs or AlGaAs and an active layer 13 of GaAs formed on the silicon substrate 11. The active layer 13 is in the form of mesa, and the gate electrode G of aluminum is formed on this mesa-type active layer 13. A part of the source electrode S and a part of the drain electrode D are connected in ohmic contact with the active layer 13. The portions of a gate pad G' extending from the gate electrode G, the source electrode S and the drain electrode D on the buffer layer 12 are formed in such a manner as not to contact the buffer layer 12 directly but through an insulating layer 1 of SiN or $SiO_2$.

Since the gate pad G', the source electrode S and the drain electrode D are formed in a manner not to contact the buffer layer 12 directly but through the insulating layer 1 as described above, the distance is lengthened between the gate pad G', the source electrode S or the drain electrode D and a low-resistance layer 20 formed by diffusion of silicon atoms into the buffer layer 12 side of the interface between the buffer layer 12 of GaAs and the silicon substrate 11. Also, in view of the fact that the relative dielectric constant of the insulating layer 1 of SiN or SiO2 is about 4 to 7 and is lower than the relative dielectric constant 13 of GaAs or the like, the parasitic capacitance generated with the gate pad G', the source electrode S or the drain electrode D through the low-resistance layer 20 can be reduced.

According to this embodiment, the buffer layer 12 between the low-resistance layer 20 and the source electrode S or the drain electrode D has a thickness of 3 μm and the insulating layer has a thickness of 0.3 μm. When compared with the conventional semiconductor device having the same thickness of a buffer layer and lacking the insulating layer 1, the parasitic capacitance of the embodiment under consideration is lower by about 50%. Also, measurement of the cut-off frequency (the upper-limit frequency capable of amplification. The higher the value of this frequency, the higher frequency of operation is possible) providing one of the high-frequency characteristics of an element shows that it is about 24 GHz according to the embodiment with an insulating layer, about 10 GHz when lacking an insulating layer (for the conventional semiconductor device) and about 23 GHz for an FET formed on a bulk GaAs substrate different from the present embodiment. This fact indicates that in the case where an FET is formed on a main substrate with a GaAs layer formed on a silicon substrate, the forming of each pad and wiring through an insulating layer as in the present embodiment leads to improved characteristics.

The desirable thickness of the insulating layer 1 is approximately 0.1 to 1 μm. The thickness of less than 0.1 μm would fail to extend the distance between the low-resistance layer and the electrodes and the parasitic capacitance cannot be reduced. The upper limit of the thickness, on the other hand, is not specifically defined and may be more than 1 μm. When the thickness exceeds 1 μm, however, the insulating layer may develop a crack and the process of etching and the like takes a considerable time. A thickness of more than necessary, therefore, is not desirable.

An example method of fabricating a field-effect transistor according to the present embodiment will be explained. FIGS. 3A to 3E are sectional views for explaining the processes of fabrication according to the present embodiment.

Figure 3A:
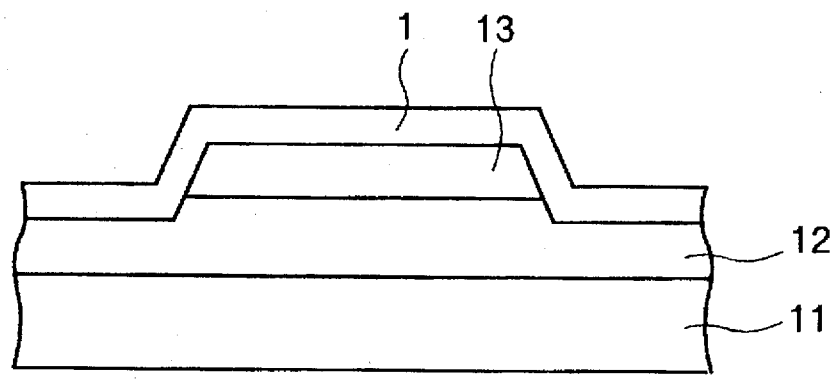
FIGS. 3A to 3E are sectional views for explaining the processes of a method for fabricating a semiconductor device according to the first embodiment of the invention.

First, as shown in FIG. 3A, GaAs or AlGaAs constituting a buffer layer 12 is deposited by epitaxial growth on a silicon substrate 11, on which GaAs providing an active layer 13 is epitaxially grown, with the active layer 13 being etched in mesa form for isolating the same active layer 13 (element separation). After mesa etching, an SiN film is formed by the CVD process as an insulating layer 1 over the entire surface of the substrate. The thickness of the insulating layer 1 is 0.3 μm as described above according to the present embodiment.

Figure 3B:
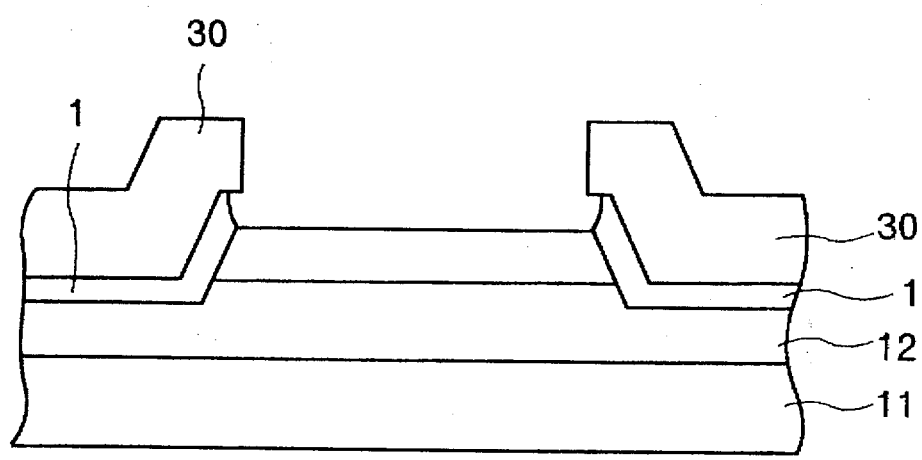

As the next step, as shown in FIG. 3B, a resist 30 is coated on the insulating layer 1, followed by removing that portion of the insulating layer 1 to be a region formed with a gate electrode G, a source electrode S and a drain electrode D on the mesa-type active layer 13, by photolithography and etching. The etching used in the process is the dry etching such as the reactive ion etching (RIE) or the chemical dry etching (CDE) or the wet etching for selectively etching off SiN.

Figure 3C:
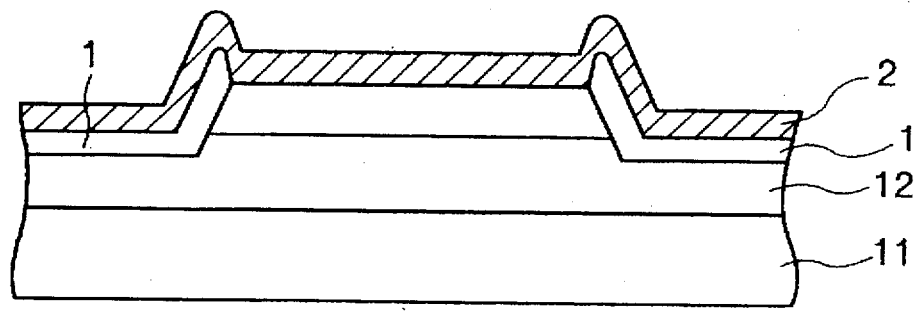

The next step, as shown in FIG. 3C, is removing the resist 30 and forming a mask film 2 of $SiO_2$ functioning as a mask in the subsequent steps.

Figure 3D:
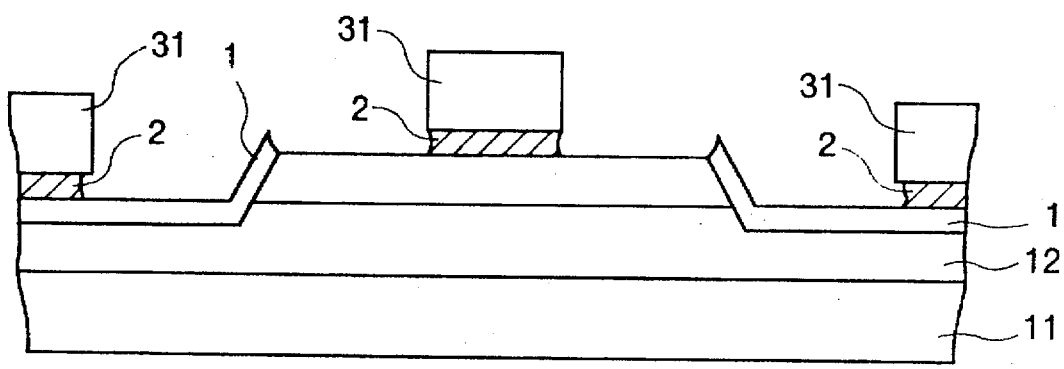

As shown in FIG. 3D, a resist 31 is coated on the mask film 2, and that portion of the mask film 2 to be formed with the source electrode S and the drain electrode D is removed by photolithography and etching. The etching used for this purpose is dry etching such as the reactive ion etching (RIE) or the chemical dry etching (CDE) or wet etching which are capable of etching off $SiO_2$ of the mask film 2 selectively between SiN of the insulating layer and $SiO_2$ of the mask film.

Figure 3E:
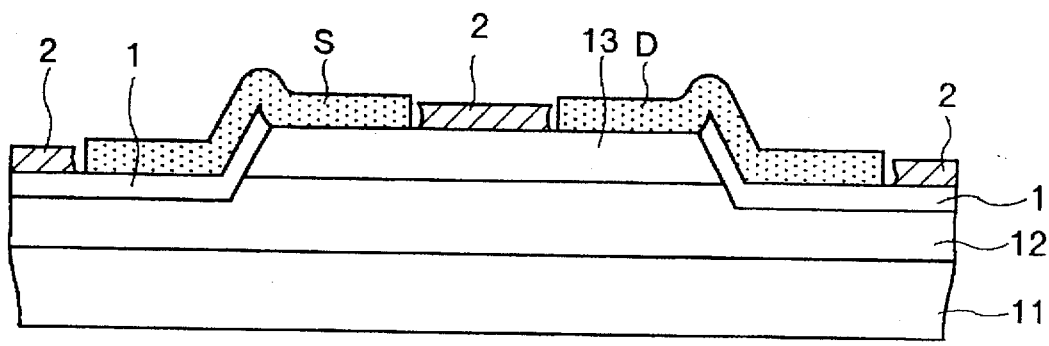

Then, as shown in FIG. 3E, with the resist 31 left unremoved, AuGe/Au or AuGe/Ni/Au constituting the source electrode S and the drain electrode D is formed by vapor evaporation, after which the resist 31 is removed for lift-off thereby to form the source electrode S and the drain electrode D.

The next step is to coat a resist, remove the portion of the mask film 2 to be formed with the gate electrode G by photolithography and etching, form an Al film by vapor deposition, remove the resist (by lift-off), and form the gate electrode G and the gate pad G' (not shown in FIGS. 3A to 3E).

The aforementioned process completes a field-effect transistor as shown in FIGS. 1 and 2.

In the above-mentioned method of fabrication, SiN is used as the insulating layer 1 and $SiO_2$ as the mask film 2 thereon by reason of the fact that the dry etching capable of forming a pattern finer than the wet etching is normally higher in etching speed for $SiO_2$ than for SiN and therefore facilitates the selective etching of the mask film 2 under the circumstances. This combination of materials is also effectively applied to the fabrication processes of wet etching using hydrofluoric acid or ammonium fluoride aqueous solution in view of the fact that the etching speed is higher for $SiO_2$. In embodying the invention, however, the insulating layer 1 is not specifically limited to an SiN film but may be composed of $SiO_2$.

According to the present embodiment, the mask film 2 formed on the insulating layer 1 as described above is required to protect the upper part of the active layer 13 and to provide a spacer for forming the gate electrode G.

Figure 4A:
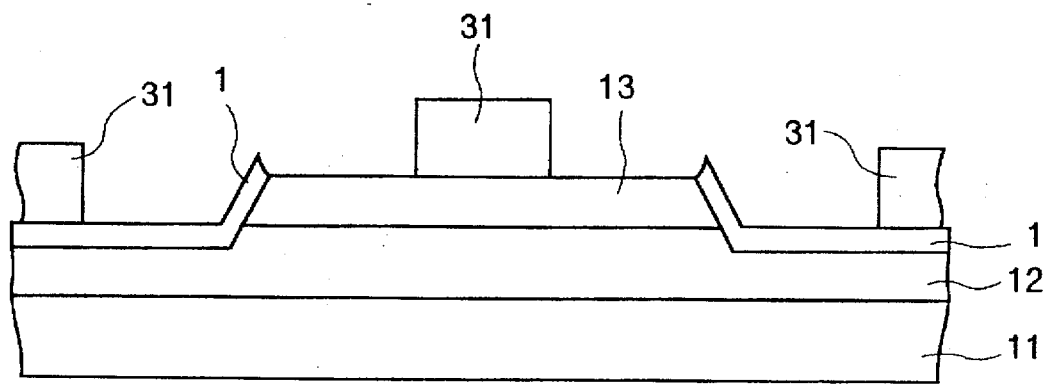
FIGS. 4A to 4C are sectional views for explaining the processes of another method for fabricating a semiconductor device according to the first embodiment of the invention.
Figure 4B:
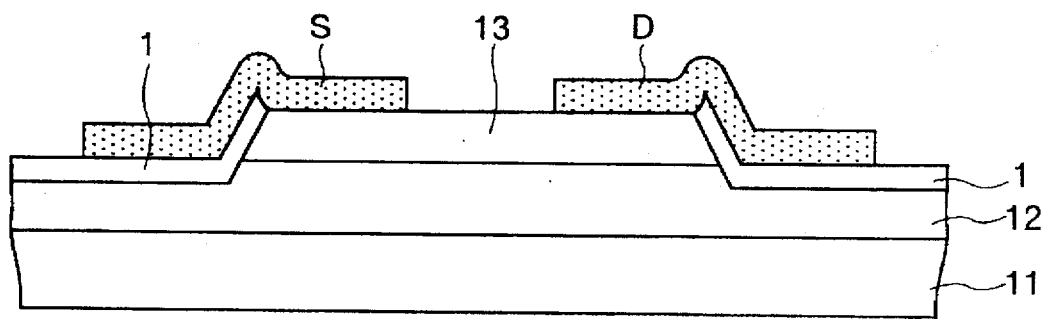
Figure 4C:
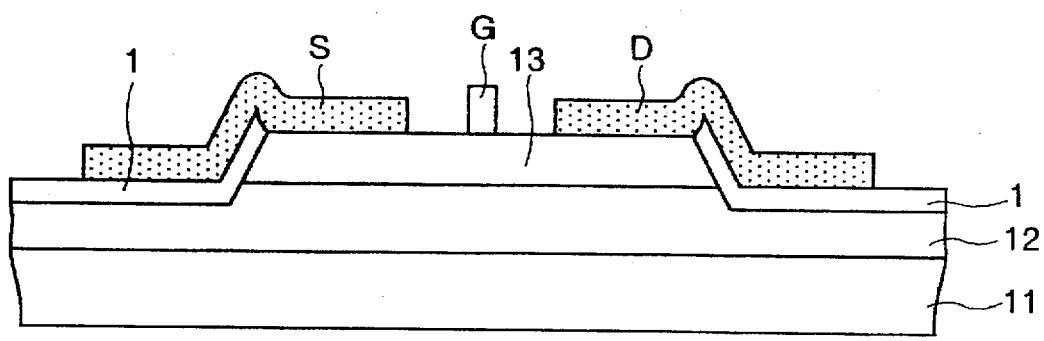

However, the mask film 2 may be omitted in the case where the spacer is not required for forming the gate electrode or, for example, in the case where the lift-off of the gate is possible simply by direct coating of a resist. More specifically, in the above-mentioned fabrication method, as shown in FIG. 4A, after the patterning of the insulating layer 1, a resist 31 is directly coated for lift-off, the patterning is effected by photolithography, the metal for the source electrode S and the drain electrode D are formed, and as shown in FIG. 4B, the lift-off operation is performed to remove the resist. After that, as described above, with the formation of the gate electrode, a field-effect transistor in the state as shown in FIG. 4C is completed.

Second Embodiment

Now, a second embodiment of the invention will be explained.

Figure 5:
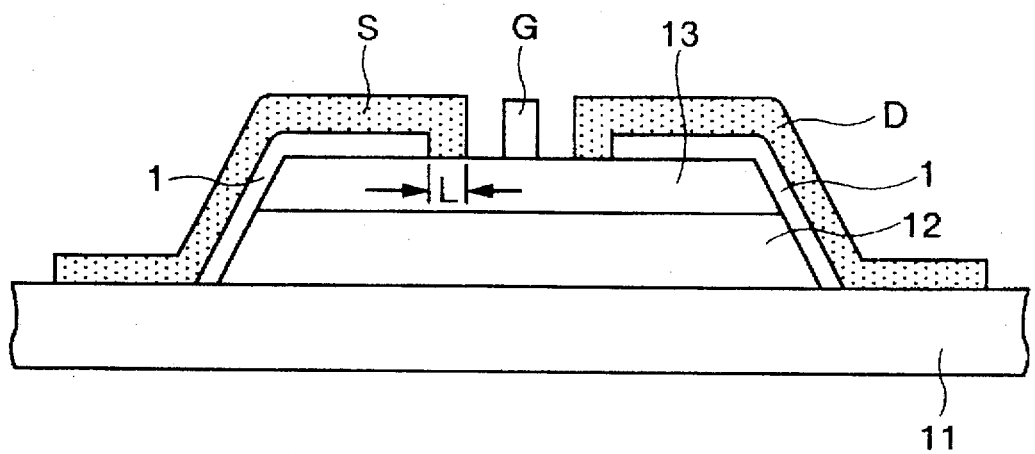
FIG. 5 is a sectional view taken along line a—a in FIG. 1 showing the sectional structure of a semiconductor device according to a second embodiment of the invention.

FIG. 5 is a diagram showing a semiconductor device having the same planar structure as in FIG. 1 and has a sectional view taken in line a—a in FIG. 1 different from FIG. 2.

In the sectional structure shown in FIG. 5 according to this embodiment, as illustrated, an insulating layer 1 is formed also on the portion of the active layer 13 arranged with the source electrode S and the drain electrode D thereon, and the length L of the junction between the active layer 13 and the source electrode S and the drain electrode D is about 5 μm as measured from the end of the junction near from the gate electrode G. Also, with the portion of the source electrode S and the drain electrode D out of contact with the active layer 13, the buffer layer 12 is also removed by mesa etching so that the source electrode S and the drain electrode D or the wirings or the pads from the electrodes is brought in contact with the silicon substrate 11.

First, the source electrode S and the drain electrode D are formed through the insulating layer 1 on the active layer 13 considering the fact that the current flowing in the source electrode and the drain electrode is concentrated at a portion about 5 μm from the end thereof near to the gate and therefore this much coupling permits a current to flow in an amount sufficient to display a function as a field-effect transistor. In view of this fact, the source electrode S and the drain electrode D are coupled with the active layer by the length L of about 5 to 20 μm, and the other part of the source electrode S and the drain electrode D are formed through the insulating layer 1, thereby reducing the parasitic capacitance at the particular portion. The lower limit of the length L should be not less than 5 μm. The length L less than 5 μm is not desirable as smooth current flow becomes impossible and the operation as a field-effect transistor becomes unstable. The upper limit of the length L, on the other hand, is not restrained by this value, but the value of about 20 μm is preferable as an excessively large value would fail to reduce the parasitic capacitance.

Further, the fact that the electrode portion or the wiring and the pad portion out of contact with the active layer 13 is brought in contact with the silicon substrate 11 facilitates emission of the heat generated during the element operation from the surface of the silicon substrate. In this way, the operation of the element can be stabilized more securely by taking advantage of the high thermal conductivity of the silicon substrate.

Although a main substrate formed with a compound semiconductor such as GaAs or AlGaAs on a silicon substrate was used according to the present embodiment, a main substrate formed with GaAs or AlGaAs on a GaAs substrate can also be used with equal effect. Also, the invention is obviously applicable to a semiconductor device with a plurality of gates as shown in FIG. 24 instead of a single-gate device.

Figure 6:
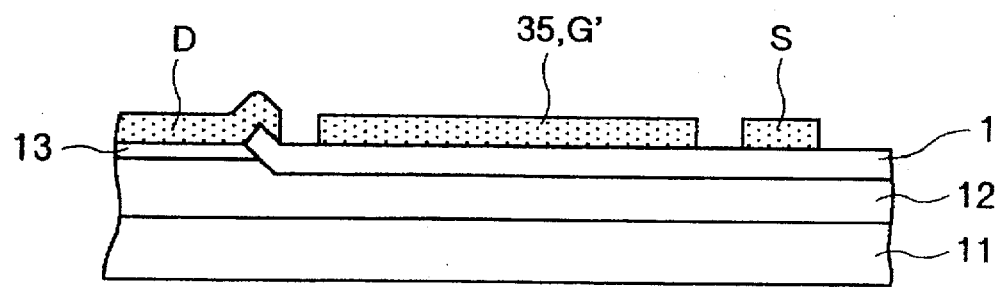
FIG. 6 is a sectional view taken along line f—f in FIG. 24 showing the sectional structure of the essential parts of a semiconductor device according to the second embodiment of the invention.
Figure 24:
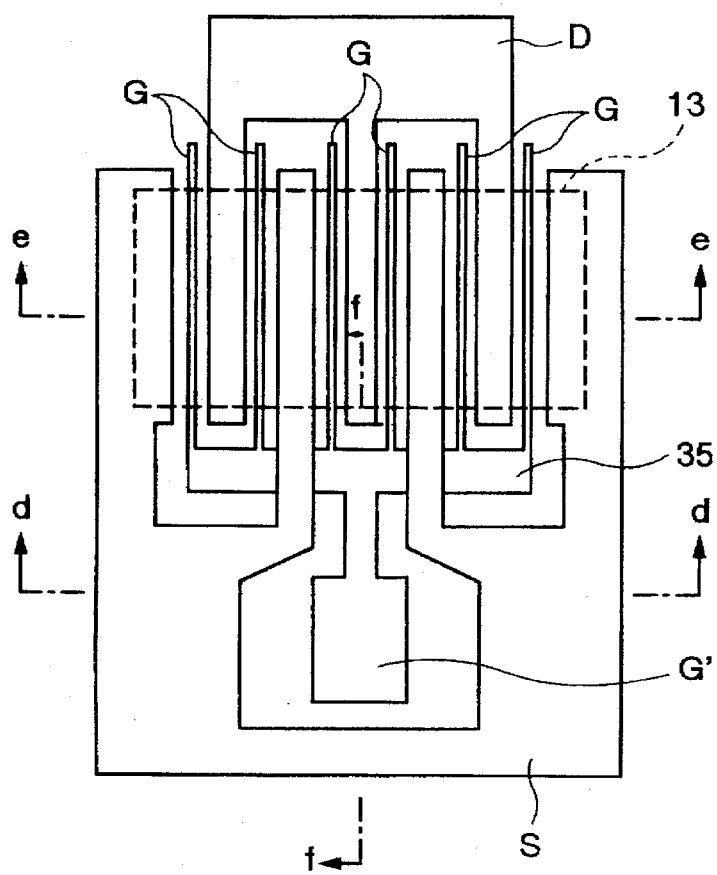
FIG. 24 is a plan view showing a conventional field-effect transistor.
Figure 25:
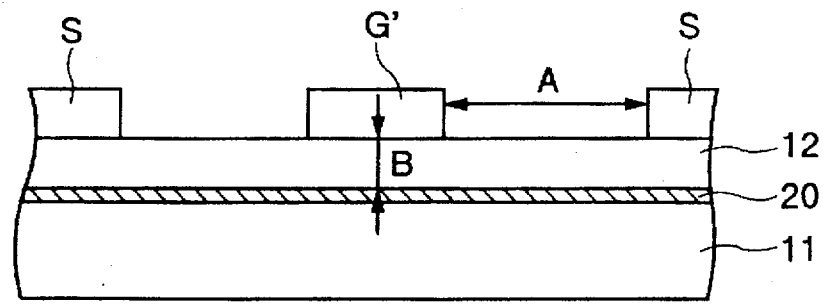
FIG. 25 is a sectional view taken along line d—d in FIG. 24 showing the sectional structure of a conventional field-effect transistor.
Figure 26:
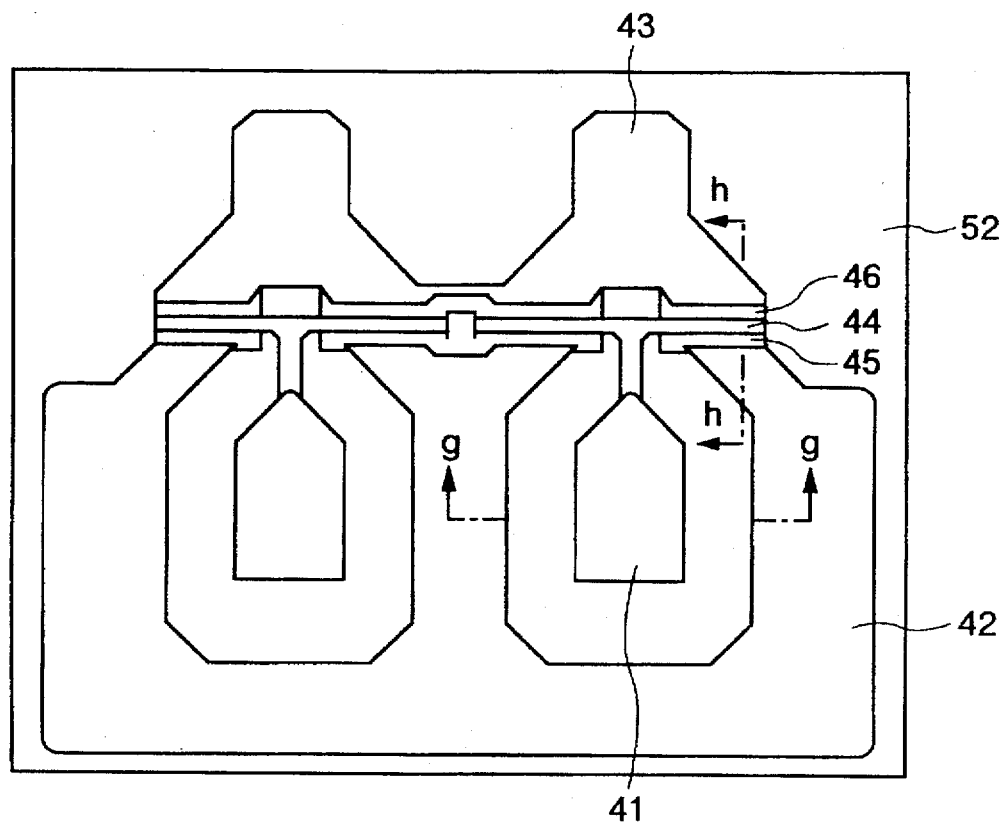
FIG. 26 is a plan view showing a conventional semiconductor device.

In other words, as in the embodiment with the sectional structure taken in line d—d in FIG. 24, the wiring and the pad from the source electrode are formed through the insulating layer 1, and a bus line (wiring) 35 from the gate electrode and the gate pad G' connected to the bus line are also formed through the insulating layer. The sectional structure (as shown in the sectional view of the essential parts taken along line f—f in FIG. 24) of the gate pad G' and the gate bus line 35 is shown in FIG. 6. The sectional structure taken in line e—e will not be described in detail as it is the same structure as that shown in FIG. 2 or 5 explained above.

As shown in FIG. 6, those portions of the gate bus line 35 and the gate pad G' which are located on the buffer layer 12 as a compound semiconductor are formed also through the insulating layer 1. The gate bus line 35 is formed in such a manner that the gate electrode G is made the same potential by each gate fin, and is formed integrally with the gate pad G'.

This gate bus line 35 is also formed through the insulating layer 1. Therefore, as already explained, the parasitic capacitance of this portion is reduced for an improved high-frequency characteristics. Especially with a power device or the like which requires a large area of the gate busline 35, the associated parasitic capacitance is increased. The aforementioned application of the invention thus effectively improves the high-frequency characteristics.

Inserting an insulating layer under the gate pad of course poses no problem in applications to the field-effect transistor of a pattern as shown in FIG. 1. The gate pad, like the source and the drain electrodes, has reduced parasitic capacitance and improved high-frequency characteristics by being formed through an insulating film.

The fabrication method for arranging an insulating film under the gate pad G' and the gate bus line 35 can be realized Simply by the above-mentioned fabrication processes being executed without removing the insulating layer 1 associated with the portion formed with the gate pad G' and the gate bus line 35 and requires no special processes.

As explained above, according to the first and second embodiments, the electrodes, the wiring or the pad of a field-effect transistor are formed through an insulating layer. This reduces the parasitic capacitance between the electrodes and therefore improves the high-frequency operation.

Also, the junction between the source/drain electrode and the compound semiconductor layer is made about 5 to 20 μm with an insulating layer formed under the electrodes. In this way, the parasitic capacitance is further reduced and the resulting capacitance reduction between source and drain can improve the high-frequency operation.

Further, a part of the electrodes, the wiring or the pads may be brought in direct contact with the silicon substrate for an improved heat radiation.

Third Embodiment

Figure 7:
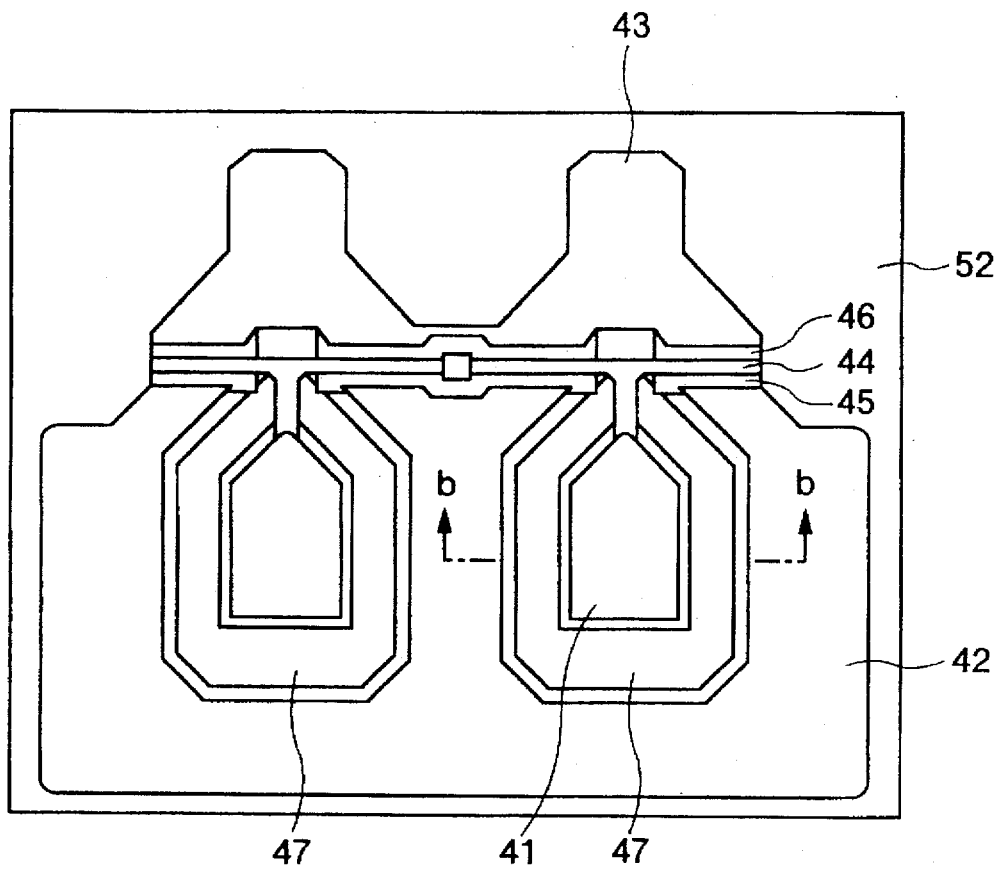
FIG. 7 is a plan view of a semiconductor device according to a third embodiment of the invention.
Figure 8:
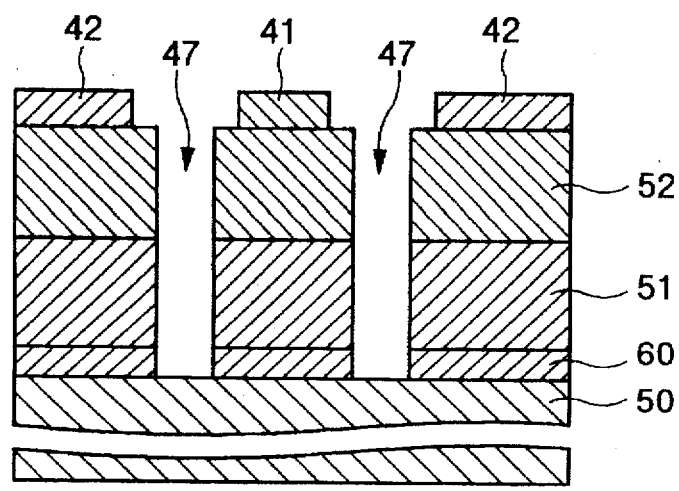
FIG. 8 is a sectional view taken along line b—b in FIG. 7 showing a semiconductor device according to the third embodiment of the invention.

FIG. 7 is a plan view of a semiconductor device according to a third embodiment of the invention, and FIG. 8 is a sectional view taken along line b—b in FIG. 7.

Figure 27A:
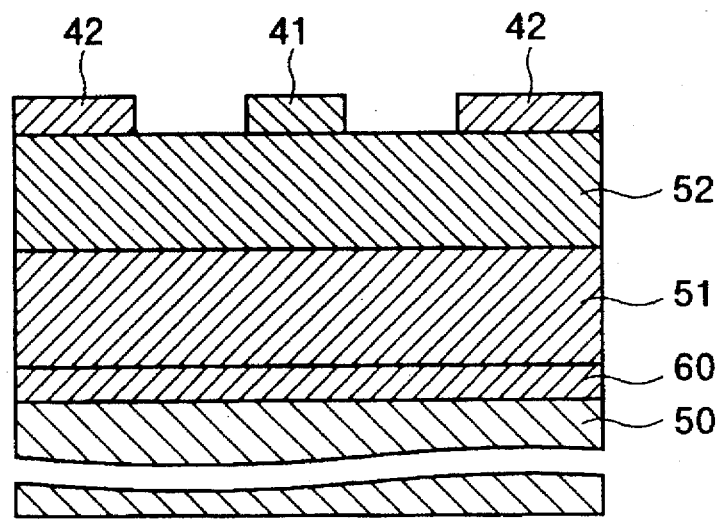
FIGS. 27A to 27B are partial sectional views taken along line g—g in FIG. 26 and taken along line h—h in FIG. 26, respectively, showing a conventional semiconductor device.
Figure 27B:
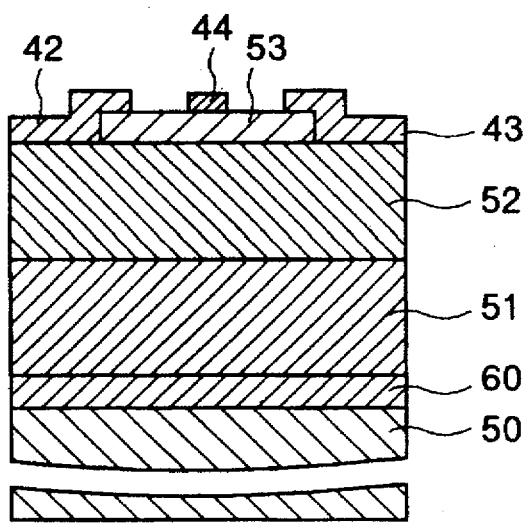
Figure 28:
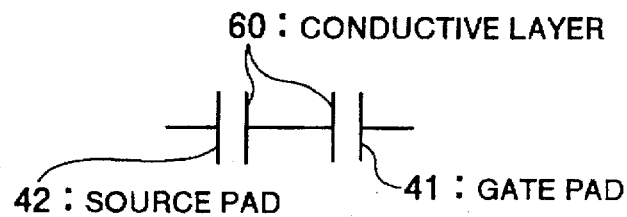
FIG. 28 is a diagram showing an equivalent circuit for explaining the parasitic capacitance of a conventional semiconductor device.
Figure 29:
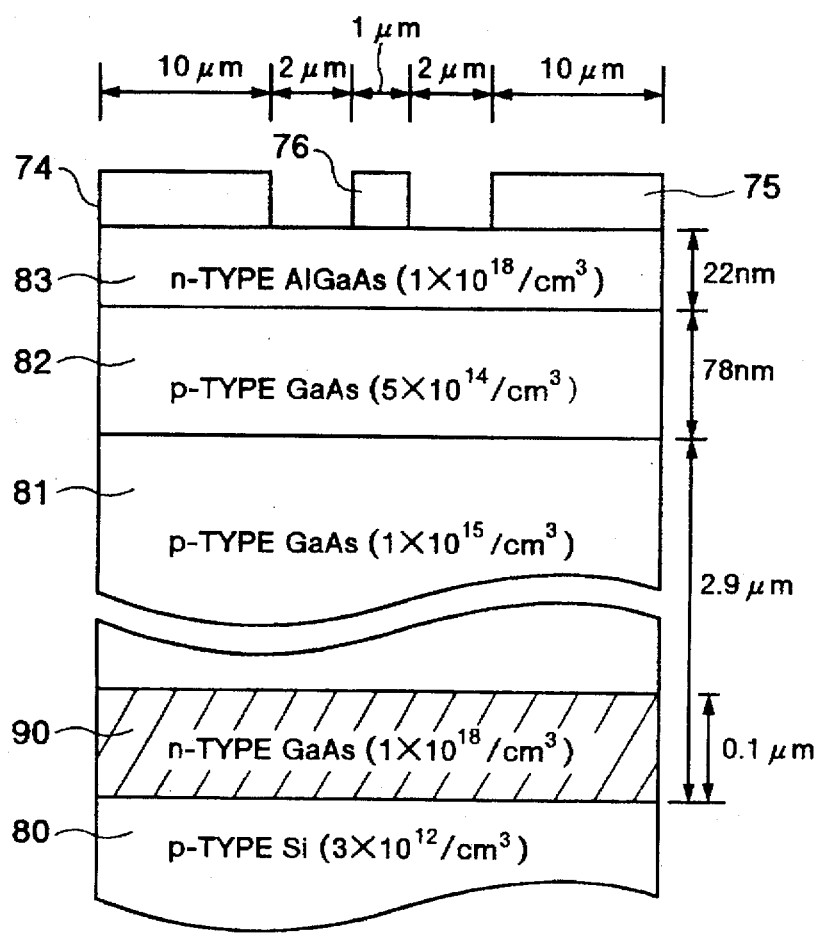
FIG. 29 is a sectional view showing a conventional semiconductor device.

This semiconductor device is an integrated form of a power GaAs MESFET. The semiconductor is structured as shown and comprises a first semiconductor layer as a high-resistance p-type silicon substrate 50 of 100 Ωcm or more or preferably 500 Ωcm or more in resistivity (the semiconductor actually used has an impurities concentration of $3 \times 10^{12} cm^{-3}$ and a resistivity of 5000 Ωcm), a second semiconductor layer as a p-type GaAs layer 51 having an impurities concentration of $1\times10^{15}\text{cm}^{-3}$ formed by epitaxial growth to the thickness of 2 μm on the p-type silicon substrate 50, and a p-type AlGaAs layer 52 having an impurities concentration of $5\times10^{16}\text{cm}^{-3}$ formed on the second semiconductor layer by epitaxial growth to the thickness of 1 μm. Further, a channel layer is formed as shown in FIG. 27B at the FET portion. As a result, an n-type conductive layer 60 diffused with silicon atoms at the peak value of a maximum of about $10^{18}\text{cm}^{-3}$ is formed on the GaAs layer 51 side of the interface between the silicon substrate 50 providing the first semiconductor layer and the GaAs layer 51 providing the second semiconductor layer.

A source pad 42, a drain pad 43 and a gate pad 41 are formed on the AlGaAs layer 52 with the channel layer removed therefrom. The interval between the source pad 42 and the gate pad 41 is 10 μm. Further, according to the present embodiment, grooves 47 having a width of 6 μm extending to the interface between the silicon substrate 50 and the GaAs layer 51 are formed by etching off the GaAs layer 51 and the conductive layer 60 in such a position as to surround the gate pad. These grooves 47 constitute a region higher in resistance than the conductive layer 60.

By forming the grooves 47 extending to the silicon substrate 50, the conductive layer 60 formed on the GaAs layer 51 side of the interface between the silicon substrate 50 and the GaAs layer 51 can be partially removed, and therefore the conductive layer 60 under the gate pad 41 can be electrically isolated as an islet from the surrounding conductive layer 60.

Figure 9B:
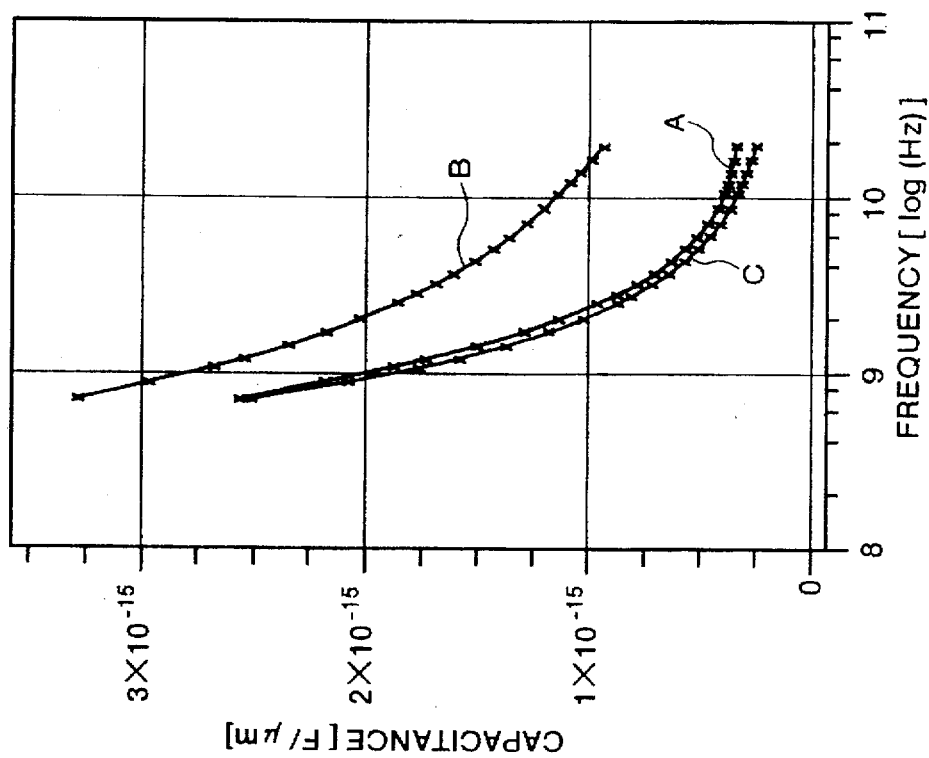
FIGS. 9A to 9B are diagrams showing the capacitance of the gate pad of a semiconductor device according to the third embodiment of the invention.
Figure 9A:
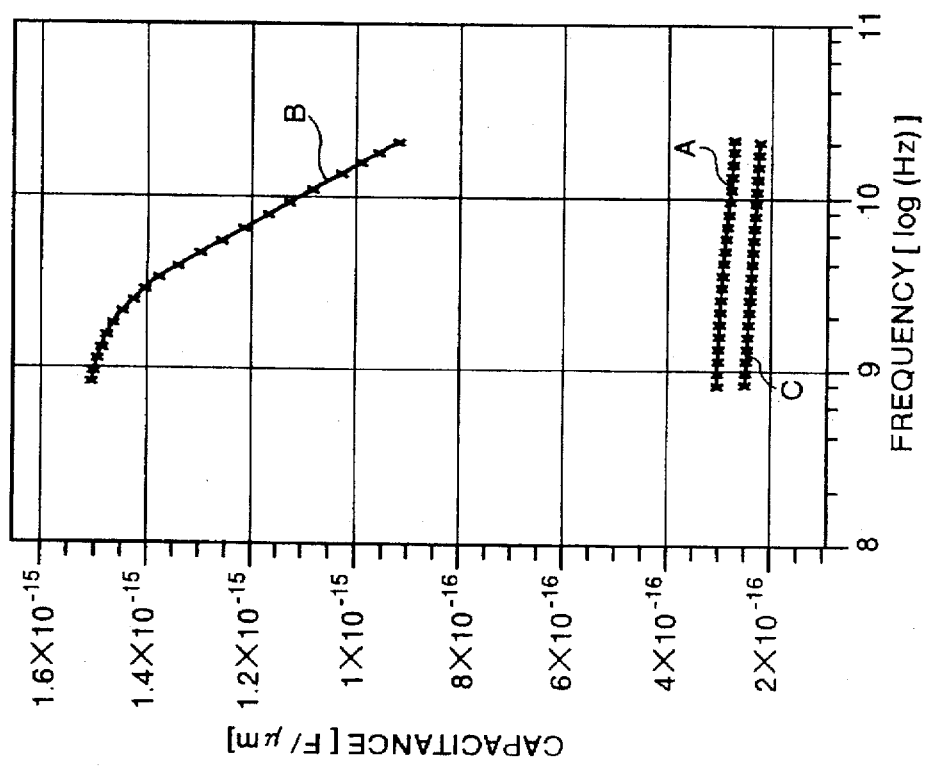

FIGS. 9A and 9B show the result of investigating the capacitance of the gate pad of a semiconductor device according to the present embodiment in the frequency range of 800 MHz to 20 GHz for the case in which the gate pad is an ohmic junction (FIG. 9A) and a Schottky junction (FIG. 9B) respectively (marked A in the graph). By way of comparison, the capacitance (marked B) of the gate pad of a conventional FET with the conductive layer not isolated as a semiconductor device is formed on a main substrate including a GaAs layer formed on a silicon substrate, and the capacitance (marked C) of the gate pad of an FET formed on a bulk GaAs substrate are also shown for the ohmic junction and the Schottky junction respectively. The pad size is 40 μm square for either case, and the capacitance is indicated (along Y-axis) with the actual capacitance divided by 40 as a capacitance per length [F/μm] assuming the width of 40 μm.

As seen from FIGS. 9A and 9B, the capacitance (A) of the gate pad with a conductive layer isolated according to the present embodiment is greatly reduced as compared with the capacitance (B) of the conventional structure with the conductive layer not isolated. The capacitance of the gate pad according to the embodiment is thus almost equivalent to that (C) using a bulk substrate.

More specifically, the series parasitic capacitance coupling generated between the gate pad and the surrounding source pad with the conductive layer as a common electrode can be remarkably reduced by electrically isolating the conductive layer corresponding to the common electrode.

According to the present embodiment, assume that the element fabricated in the semiconductor device is a field-effect transistor (FET) like a MESFET or a high electron mobility transistor (HEMT). The adverse effect due to the parasitic capacitance in a semiconductor device can be efficiently removed by surrounding the conductive layer beneath the wiring or pad for the gate electrode of the FET with a high-resistance region. This is by reason that the source and the drain are usually connected to the earth or the power supply and therefore are not substantially subject to variations in potential in normal FET applications. The potential applied to the gate, in contrast, controls the FET operation and undergoes drastic variations, therefore the adverse effects due to the parasitic capacitance in a semiconductor device can be removed by reducing the parasitic capacitance at the wiring and pad of the gate.

Further, a high-resistance region surrounding a conductive layer may include adjacent electrodes, wiring or pads electrically connected and varying always in the same potential, i.e., those components supplied with the same potential may be structured as a single region to isolate a conductive layer. It is thus possible to reduce the parasitic capacitance in this region supplied with an equal potential.

The grooves 47 for isolating the conductive layer 60 function to electrically isolate the conductive layer 60 under the gate pads 41. Therefore, the width of the groove 47 is not limited to 6 μm, but in order to improve the integrity as a semiconductor device, may be smaller. The etching process to be used may include the dry etching such as reactive ion etching (RIE) or chemical dry etching (CDE) or the wet etching used for the fabrication of semiconductor devices with a compound semiconductor. The grooves 47 need not be left in the form of groove as according to the present embodiment. Instead, these grooves may be filled in with an insulating film by CVD or by deposition of $SiO_2$ or SiN, for example. Consequently, the subsequent construction of a structure on the substrate is facilitated.

Fourth Embodiment

Figure 10:
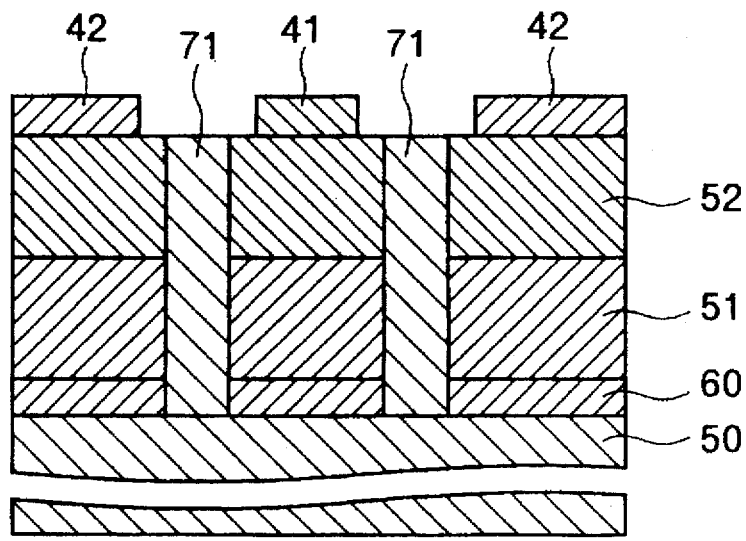
FIG. 10 is a sectional view taken along line b—b in FIG. 7 showing a semiconductor device according to a fourth embodiment of the invention.

FIG. 10 is a sectional view for explaining a fourth embodiment of the invention (taken in line b—b in FIG. 7), in which the surface electrodes, wiring and the pads have the same structure as those in FIG. 7.

According to this embodiment, the structure of the FET is exactly identical to that of the third embodiment. A GaAs layer 11 is formed to the thickness of 2 μm on a silicon substrate and an AlGaAs layer 12 is deposited thereon to the thickness of 1 μm. A channel layer 13 is formed only at the FET portion, while the source, drain and the gate pads are formed on the AlGaAs layer 12.

According to the embodiment, a conductive layer 60 is isolated by injecting hydrogen ions ($H^+$) at the portion corresponding to the groove 47 in FIG. 7. The ion injection damages the crystal properties of the GaAs layer 51 of the ion injection region 71 thus formed, so that the portion injected with ions becomes a high-resistance region. As in the third embodiment, therefore, the conductive layer 60 under the gate pad 41 is isolated like an islet. As a consequence, the parasitic capacitance of the gate pad 41 is reduced as according to the third embodiment.

The amount of ions in terms of dosage injected according to this embodiment is approximately $1\times10^{13}$ to $1\times10^{14}\text{cm}^{-2}$ with an acceleration voltage of about 280 to 320 kV. The acceleration voltage is set to this value in order to enable the injected hydrogen ions to reach the surface of the silicon substrate 50 in view of the fact that the combined thickness of the compound semiconductor layer including the GaAs layer 51 and the AlGaAs layer 52 is 3 μm. With the variation of the thickness of the compound semiconductor layer on the silicon substrate, an appropriate adjustment of course is required so that the injected ions may reach the interface between the first semiconductor layer and the second semiconductor layer. With the dosage of less than $1\times10^{13}\text{cm}^{-2}$, the crystal of the GaAs layer 11 may fail to be damaged, thereby often leading to an insufficient isolation of the conductive layer. With regard to the upper limit of dosage, on the other hand, even in the case where the dosage exceeds $1\times10^{14} cm^{-2}$, the ion injection, which is solely intended for isolation of the conductive layer 60, is not effective to a proportionately higher degree. Taking the cost of ion injection process into account, therefore, the dosage should not be increased unnecessarily.

In place of hydrogen ions, oxygen or chromium ions may be injected with equal effect.

Fifth Embodiment

Figure 11:
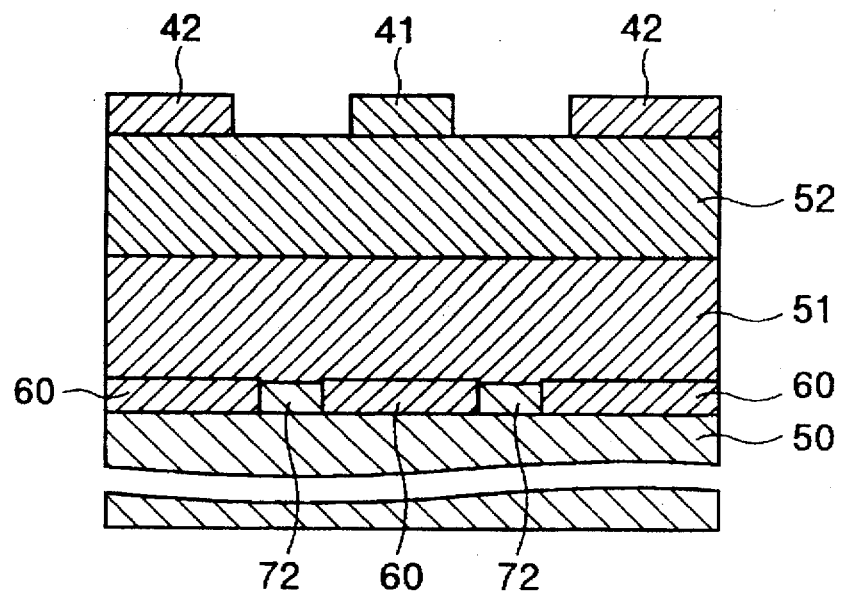
FIG. 11 is a sectional view taken along line b—b in FIG. 7 showing a semiconductor device according to a fifth embodiment of the invention.

FIG. 11 is a sectional view (taken in line b—b in FIG. 7) for explaining a fifth embodiment of the invention, in which the structure of the surface electrodes, wiring and pad is similar to that of FIG. 7.

According to this embodiment, the FET structure is exactly the same as that of the third embodiment. Like in the third embodiment, a GaAs layer 51 having a thickness of 2 μm and an AlGaAs layer 52 having a thickness of 1 μm are deposited on a silicon substrate 50, and a channel layer 53 is formed only at the FET portion. The source, drain and the gate pads are formed on the AlGaAs layer 52.

In the embodiment under consideration, the conductive layer 60 is isolated by forming an insulating film 72 on the silicon substrate 50 at the portion corresponding to the grooves 47 in FIG. 7 before epitaxial growth of the GaAs layer 51. The formation of the insulating layer 72 in the interface between the silicon substrate 50 and the GaAs layer 51 prevents diffusion of silicon atoms from the silicon substrate 50 at the interface to the GaAs layer 51, with the result that a conductive layer is prevented from being formed on the GaAs layer 51, while a high-resistance region is formed partially in the conductive layer 60.

More specifically, according to this embodiment, an insulating film 72 is formed in such a position as to surround the portion under the gate pad 41. In this way, the conductive layer 60 under the gate pad 41 is isolated into an islet thereby to reduce the parasitic capacitance of the gate pad 41 like in the third embodiment.

The insulating layer 72 is made of $SiO_2$ or SiN, for example, which preferably has a thickness of about 10 to 100 nm for preventing the diffusion of silicon to the GaAs layer 51. With the thickness of less than 20 nm, which is too thin depending on whether the insulating film thus formed is of $SiO_2$ or SiN, diffusion of silicon cannot be completely prevented. Even the thickness of more than 100 nm, in contrast, fails to contribute further to the effects of the invention in view of the fact that the insulating film is intended to prevent silicon diffusion and that the thickness of the conductive layer in GaAs formed by silicon diffusion is at most about 100 nm. An excessively large thickness may cause damage to of the GaAs layer formed on the insulating film, and therefore the insulating layer need not be unnecessarily thick.

In the third to fifth embodiments described above, only the gate pad 41 is surrounded by a region higher in resistance than the conductive layer. With a pattern layout where the wiring is lengthened from the gate 44 to the gate pad 41, on the other hand, the parasitic capacitance of the gate wiring and the gate pad can be reduced as in the third to fifth embodiments by surrounding the lengthened wiring and the gate pad as a single region with the high-resistance region.

As described above, according to the third to fifth embodiments, the conductive layer formed on the second semiconductor layer side of the interface between the first semiconductor layer and the second semiconductor layer is isolated by a high-resistance region. The parasitic series capacitance coupling between an electrode, a wiring and a pad on the one hand and a surrounding electrode, a surrounding wiring and a surrounding pad on the other hand with the conductive layer as a common electrode can thus be remarkably reduced by electrically isolating the conductive layer corresponding to the common electrode.

Sixth Embodiment

A sixth embodiment of the invention will be explained with reference to the accompanying drawings.

Figure 12:
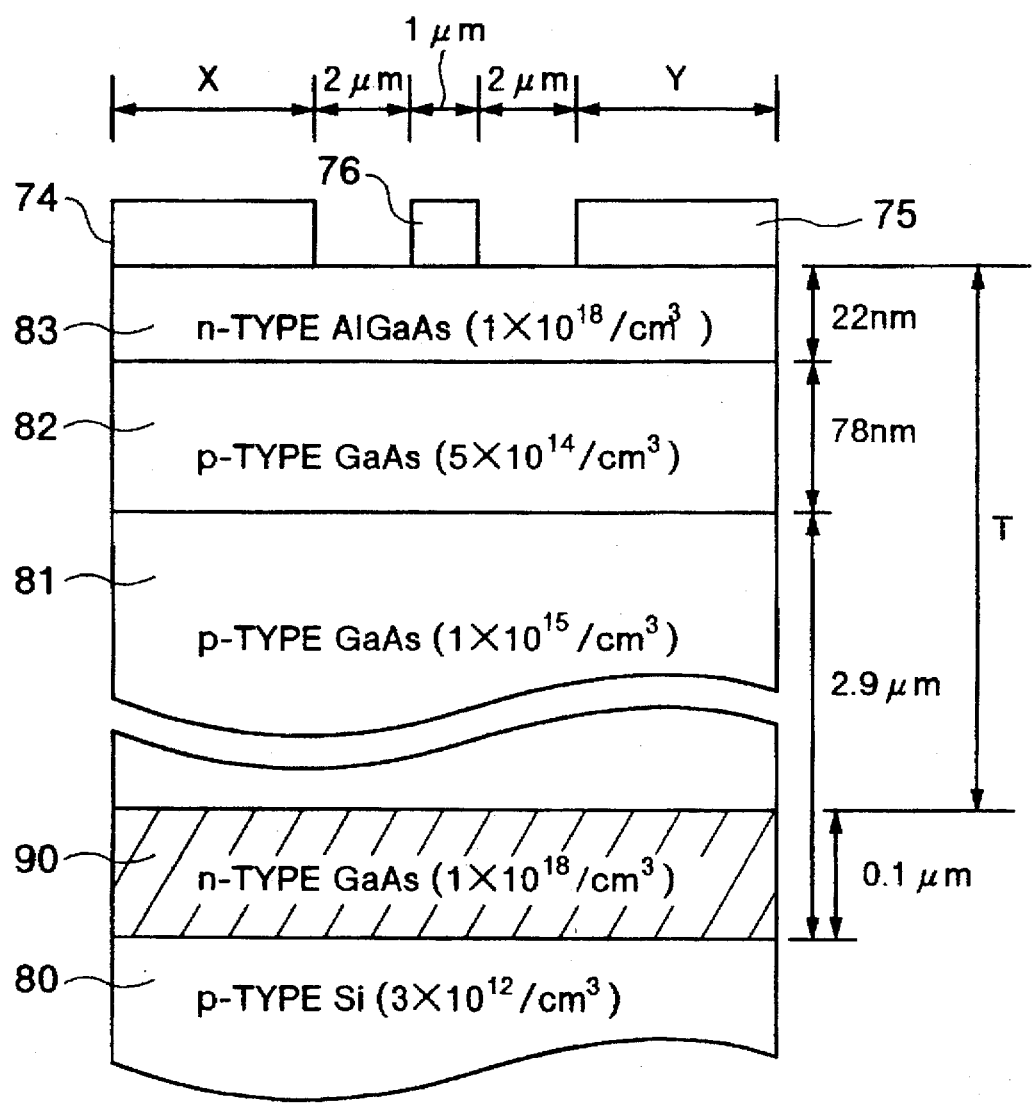
FIG. 12 is a sectional view of a semiconductor device according to a sixth embodiment of the invention.
Figure 13:
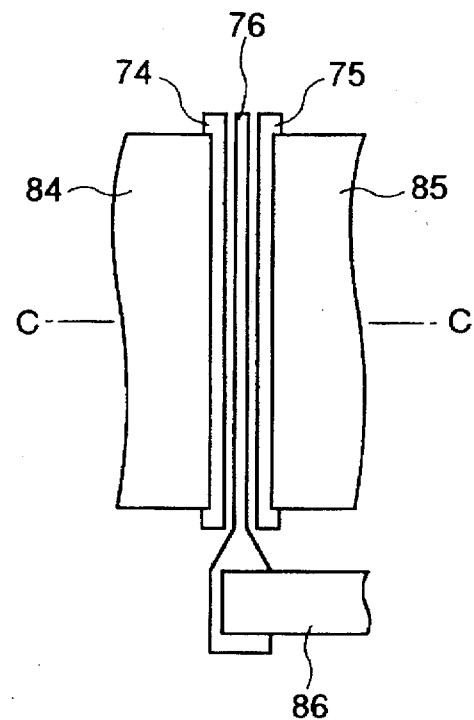
FIG. 13 is a plan view showing the electrode structure of a semiconductor device according to the sixth embodiment of the invention.

FIG. 12 is a sectional view of an E-HEMT providing a semiconductor device according to the sixth embodiment. As shown in FIG. 13, a source electrode 74 and a drain electrode 75 are formed with a gate electrode 76 interposed therebetween. The electrodes are formed with a source metal wiring 84, a drain metal wiring 85 and a gate metal wiring 86, respectively. FIG. 12 is a sectional view showing the source and drain electrodes taken in line c—c in FIG. 13 as seen along the running direction of carriers. The metal wirings are not shown.

The structure of this semiconductor device comprises, as shown in FIG. 12, a p-type silicon substrate 80 as a semiconductor substrate having an impurities concentration of $3\times10^{12}/cm^3$, a p-type GaAs layer 81 having an impurities concentration of $1\times10^{15}/cm^3$ and a thickness of 2.9 μm, a p-type GaAs layer 82 having an impurities concentration of $5\times10^{14}/cm^3$ and a thickness of 78 nm, and an n-type AlGaAs layer (with Al 0.3, Ga 0.7, As) 83 having an impurities concentration of $1\times10^{18}/cm^3$ and a thickness of 22 nm, deposited in that order upward respectively by epitaxial growth. The source electrode 74, the drain electrode 75 and the gate electrode 76 of an E-HEMT are thus formed on the n-type AlGaAs layer 83, and an n-type GaAs layer having an impurities concentration of about $1\times10^{18}/cm^3$ and a thickness of about 0.1 μm is formed in the interface between the silicon substrate 80 and the GaAs layer 81, thereby generating an interfacial conductive layer 90 low in resistance value.

The lengths X and Y of the source electrode 74 and the drain electrode 75 in the running direction of carriers are given to satisfy equations (1) and (2) below.

$$1 \, \mu m \leq X \leq T \quad (1)$$

$$1 \, \mu m \leq Y \leq T \quad (2)$$

In other words, in the semiconductor device under consideration, the shortest distance T between the silicon substrate interface (which is substantially an interfacial conductive layer) and the electrodes is 3.0 μm, and therefore X and Y are determined as a value between 1 and 3 μm.

With regard to a semiconductor device formed with this E-HEMT, explanation will be given about the device characteristics as determined by simulation with different contact lengths X and Y of the source and drain electrodes along the running direction of carriers. The simulation used the software item "BLAZE" made by SILVACO Co., thereby making it possible to obtain the result similar to actual device characteristics.

Figure 14:
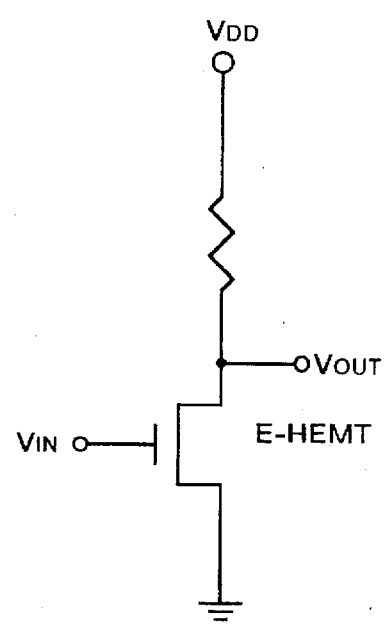
FIG. 14 is a circuit diagram showing an inverter.

The simulation was conducted with an inverter as a model including the E-HEMT and a resistor element as shown in the circuit diagram of FIG. 14.

Figure 15:
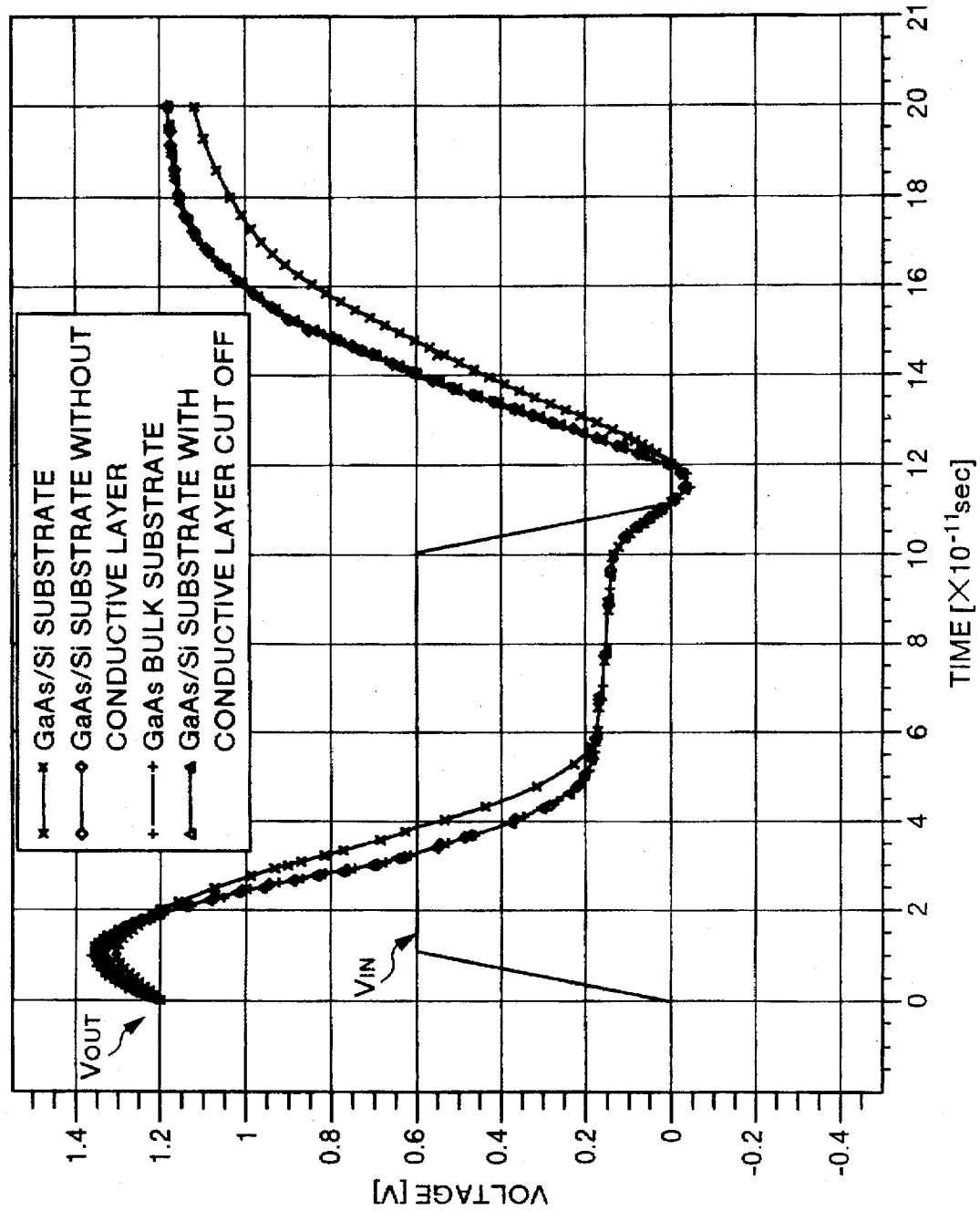
FIGS. 15 to 22 are diagrams showing the result of simulation.

FIG. 15 is a diagram showing the waveform characteristic of the drain output $V_{OUT}$ for the case in which the gate input $V_{IN}$ of the inverter model shown in FIG. 14 is supplied with a pulse waveform having a rise time and a fall time of 10 psec. As shown, in the case where the interfacial conductive layer 90 is lacking or the interfacial conductive layer 90 is electrically isolated midway, the same $V_{OUT}$ characteristics are obtained as when the E-HEMT is formed on a bulk GaAs substrate. In the event that the interfacial conductive layer 90 is formed, in contrast, the characteristics are obviously deteriorated with a delayed signal transmission. In all the above cases, the contact lengths X and Y of the source and drain electrodes in the running direction of carriers are set to 10 µm as in an ordinary E-HEMT.

It is seen from this diagram that substantially the same characteristics as those with the bulk substrate are obtained in the case where an interfacial conductive layer is lacking, i.e., in the case where no parasitic capacitance is generated in the source and drain electrodes and in the case where, in spite of the presence of an interfacial conductive layer, the parasitic capacitances generated in the source and drain electrodes are not coupled to each other as a result of isolation of the interfacial conductive layer between source and drain. It is thus noted that the cause of the characteristics deterioration of the E-HEMT formed with GaAs on the silicon substrate is the parasitic capacitance generated between the source/drain electrode and the interfacial conductive layer.

The structure lacking an interfacial conductive layer or the structure having an interfacial conductive layer isolated between source and drain is fabricated by simulation after all, and cannot be realized as an actual device. First, as to the interfacial conductive layer, an interfacial conductive layer is always formed in the hereto junction interface at the time of epitaxial growth of GaAs on the silicon substrate. This interfacial conductive layer can never be eliminated. Next, in view of the fact that the distance between the source and drain electrodes of an actual device is as small as several µm with the gate therebetween, any attempt to cut off only the interfacial conductive layer in the silicon substrate interface within a single transistor is a very difficult task and is actually impossible without damaging the topmost device-formed region with the current techniques of fine processing.

Accordingly, the inventors took note of the fact that a parasitic capacitance between the source and drain electrodes causing the characteristics deterioration assumes a value proportional to the contact length along the running direction of carriers and substantially inversely proportional to the distance from the contact to the interfacial conductive layer. The inventors thus determined a range in which the characteristics substantially identical to those with a bulk GaAs substrate is obtainable by limiting the contact lengths of the source and drain electrodes along the running direction of carriers.

Figure 16:
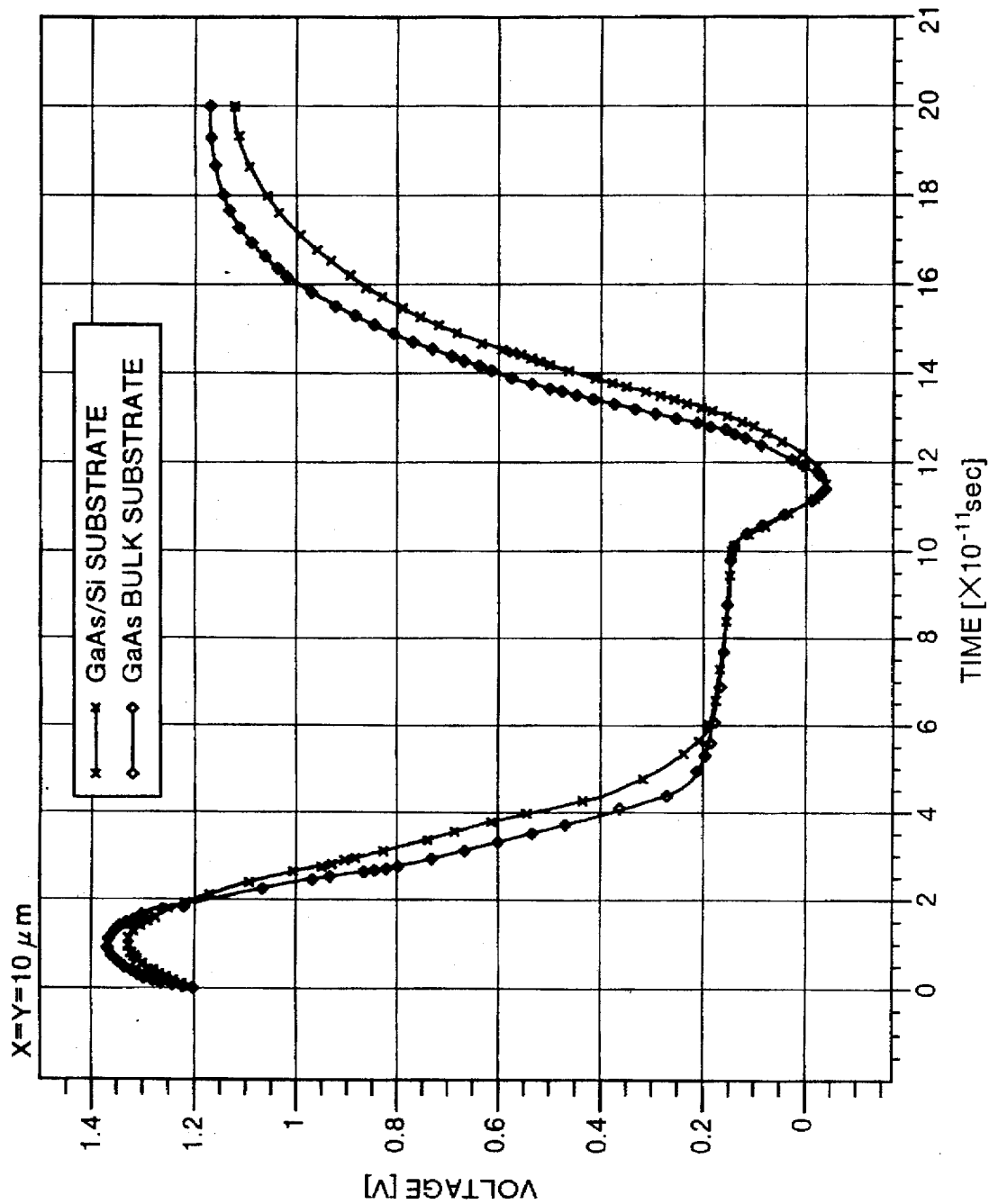

FIG. 16 is a diagram showing the $V_{out}$ characteristics for a bulk GaAs substrate and the corresponding characteristics for a compound semiconductor layer formed on a silicon substrate as extracted from FIG. 15 for facilitating the understanding.

Figure 17:
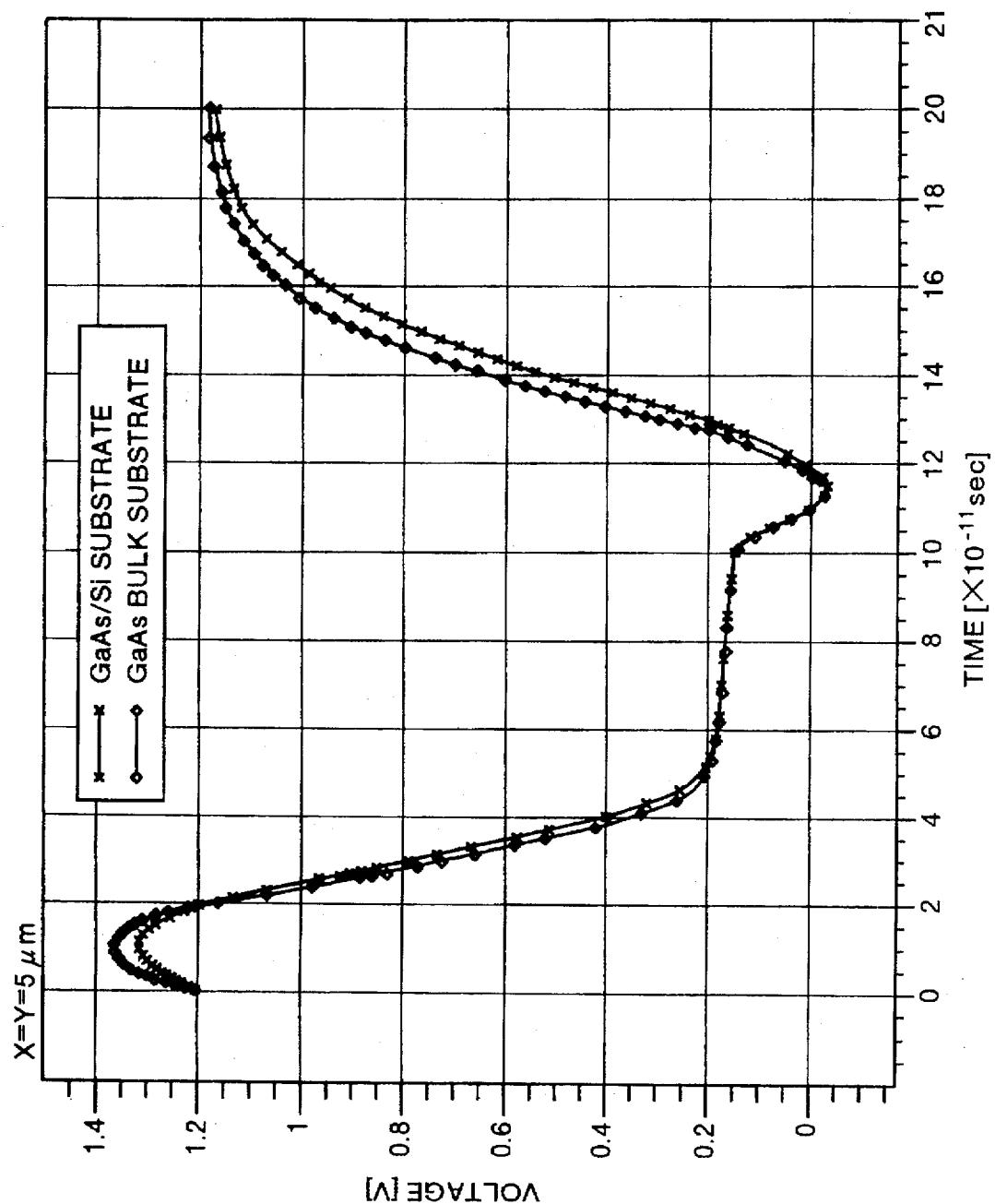

FIG. 17 is a diagram showing the $V_{OUT}$ characteristics of an E-HEMT formed on a bulk GaAs substrate and an E-HEMT formed with a compound semiconductor layer on a silicon substrate for the lengths X and Y of 5 µm. The input signal is the same as that in FIG. 15. This diagram shows that the characteristics are somewhat improved as compared with those of FIG. 16.

Figure 18:
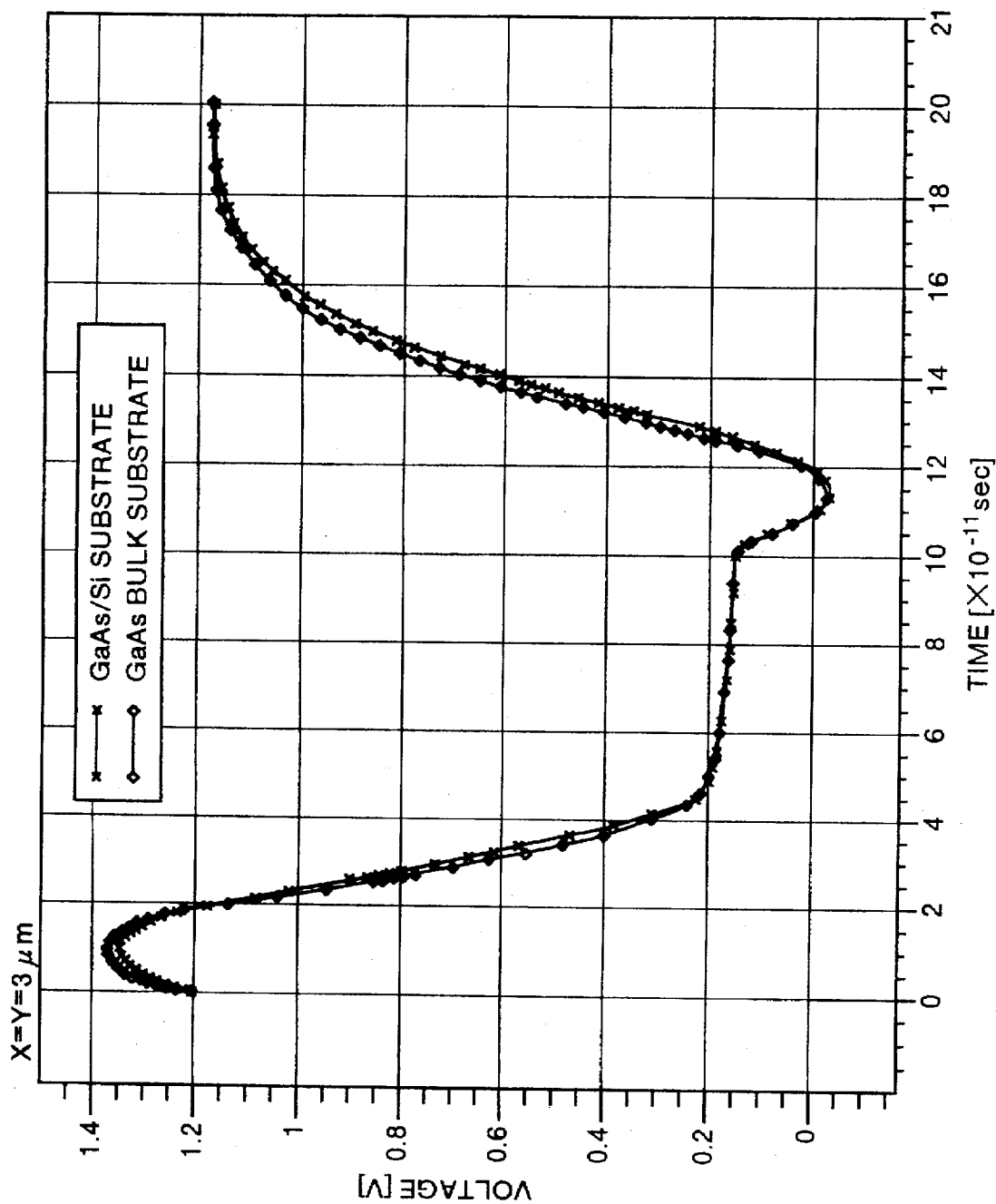

FIG. 18 is a diagram similarly showing the $V_{OUT}$ characteristics for the lengths X and Y of 3 µm. This diagram indicates that the characteristics are further improved over the case of FIG. 17.

Figure 19:
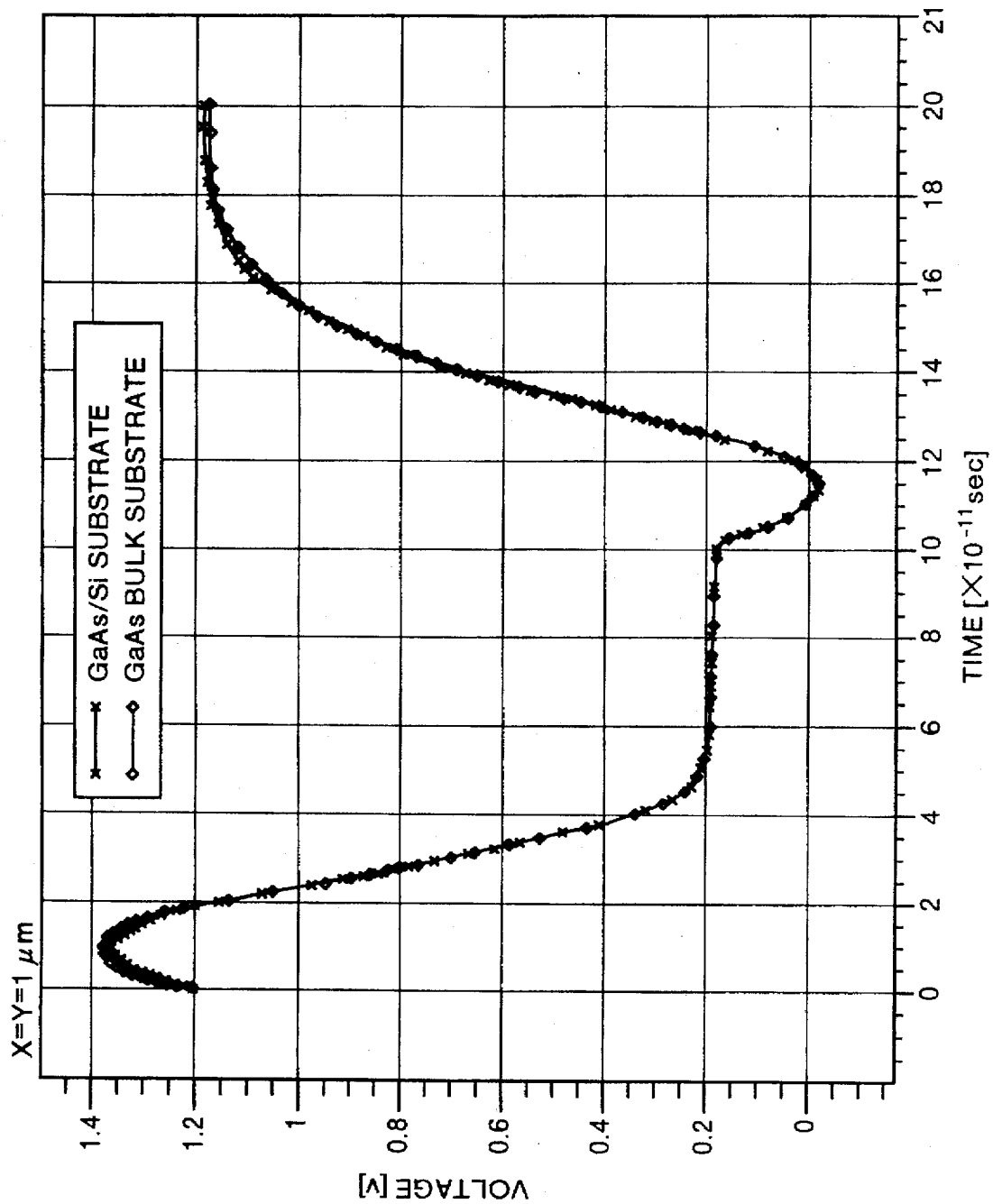

The $V_{OUT}$ characteristics for the lengths X and Y of 1 µm are shown in FIG. 19. This diagram shows that the characteristics are improved even further as compared with those of FIG. 18 to the degree substantially similar to the device on a bulk GaAs substrate.

Figure 20:
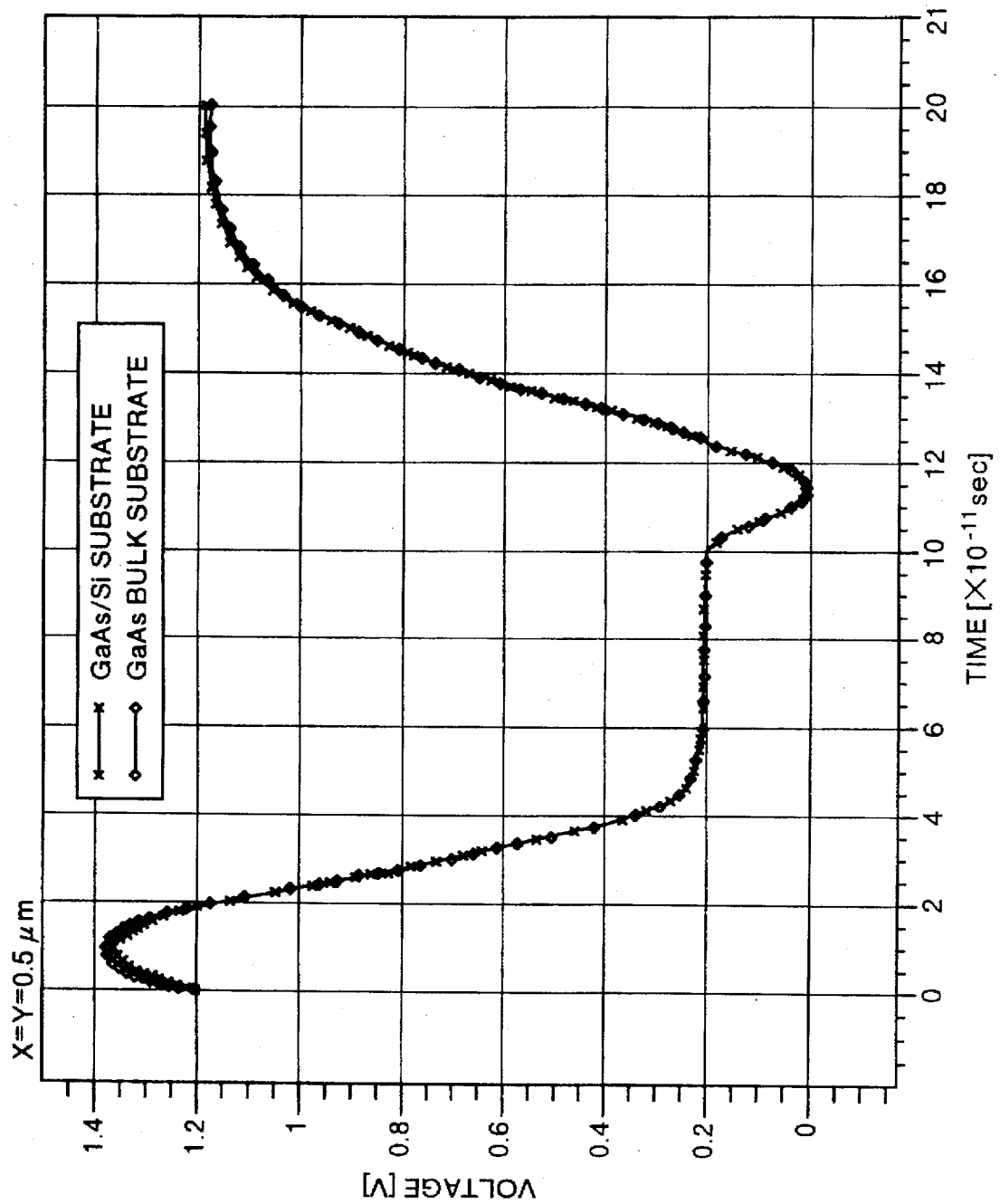

FIG. 20 is a diagram showing the $V_{OUT}$ characteristics for the lengths X and Y set of 0.5 µm in a manner similar to the preceding ones. This diagram indicates that the $V_{OUT}$ characteristics are identical to those of the device on a bulk GaAs.

Figure 21:
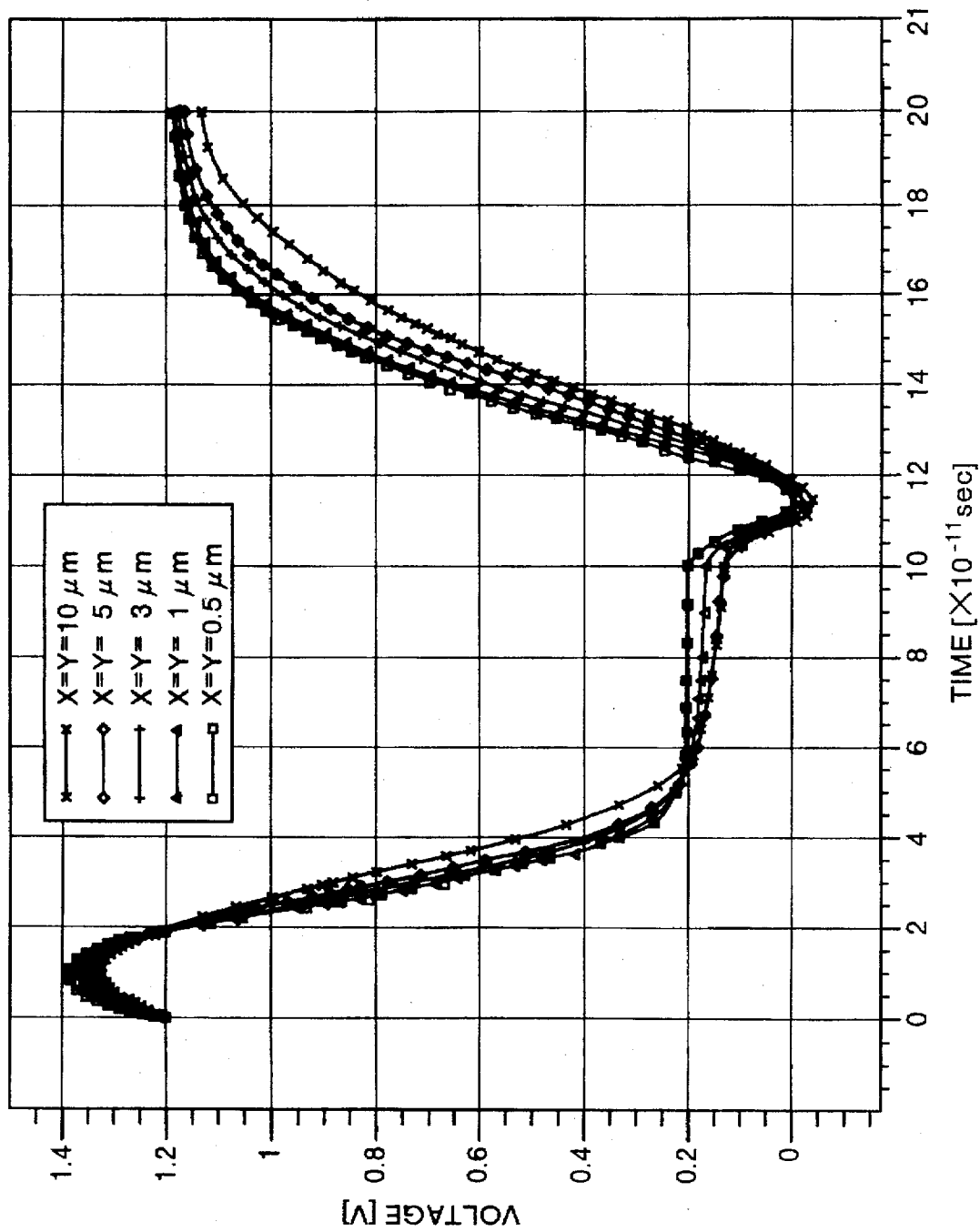

FIG. 21 shows the $V_{OUT}$ characteristics for each length of X and Y plotted on a single diagram. This diagram indicates that with the shortening of X and Y, the signal transmission delay is reduced. The signal voltage is subjected to variations as shown for the lengths X and Y of 1 µm and 0.5 µm, however, due to an increased series resistance component.

Figure 22:
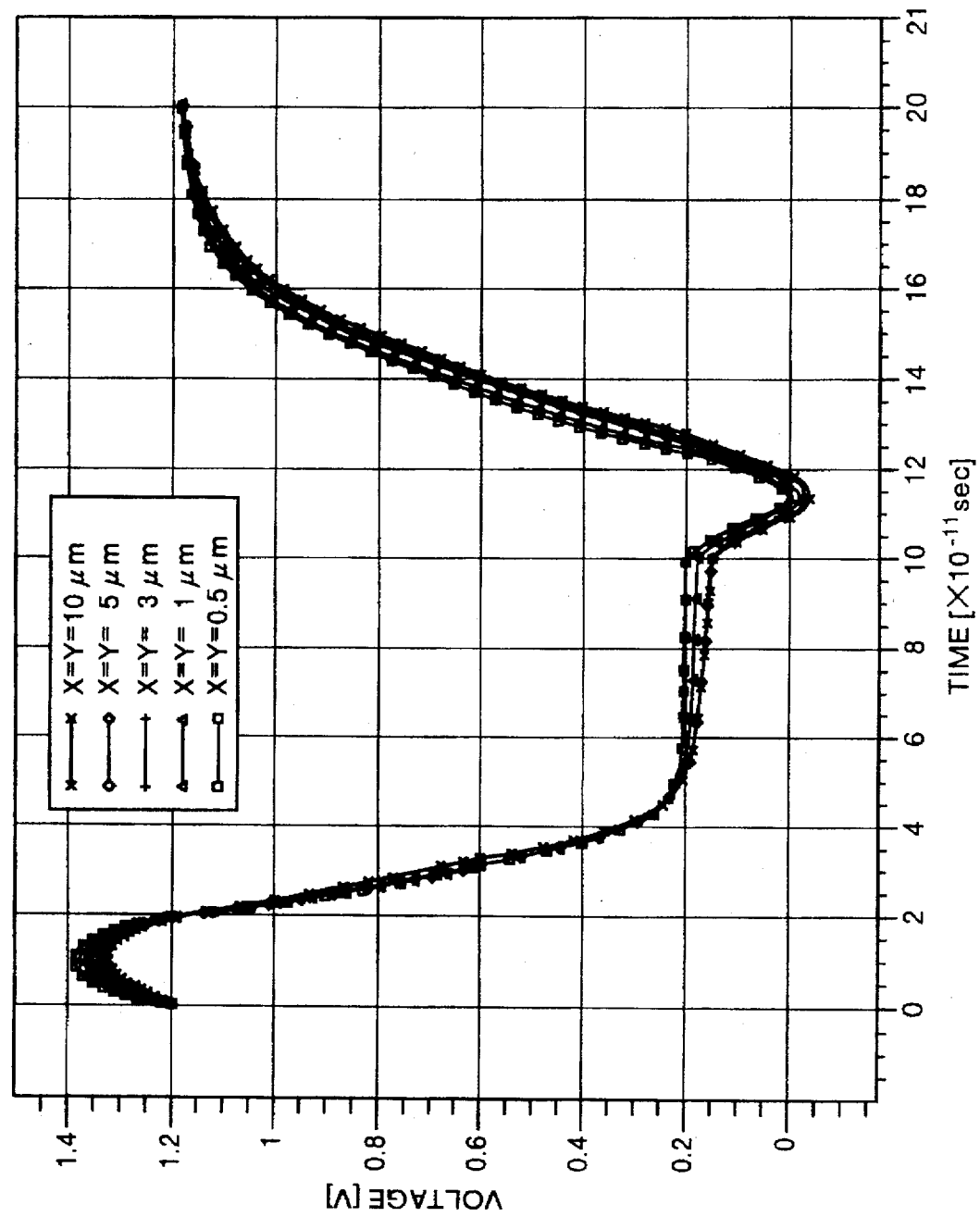
Figure 23:
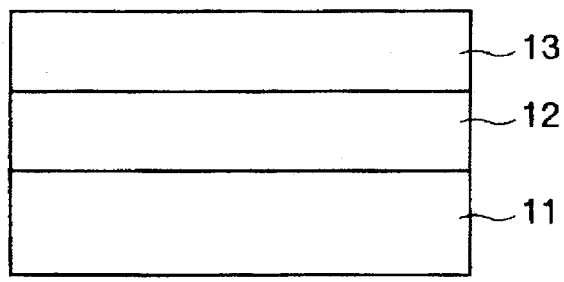
FIG. 23 is a sectional view of a main substrate with a compound semiconductor layer formed on a silicon substrate.

FIG. 22 shows the result of simulation effected with the lengths X and Y changed on the assumption that a conductive layer is lacking with a compound semiconductor layer formed on a silicon substrate as in the present embodiment. The signal transmission delay is substantially the same for all the cases. With the lengths X and Y of 1 µm and 0.5 µm, however, the voltage is subjected to variations as in the case of FIG. 21. This indicates that the voltage variation is caused by the effect of a contact resistance for the lengths of X and Y of 1 µm or less.

The result of the foregoing simulation shows that a semiconductor device according to the present embodiment with the lengths of X and Y set within the range defined by equations (1) and (2) respectively exhibits satisfactory characteristics substantially equivalent to those of a semiconductor device using a bulk GaAs substrate when applied to a circuit handling high-speed digital signals. It is confirmed that the satisfaction of at least one of equations (1) and (2) leads to some positive effect.

It will thus be understood from the foregoing description that according to the present embodiment, it is possible to avoid the cause of characteristics deterioration such as transmission delay unique to various types of transistors fabricated on a main substrate with a compound semiconductor layer formed on a silicon substrate. As a consequence, a digital circuit of superior characteristics free of characteristics deterioration and having a sufficiently low contact resistance can be fabricated by using the lengths of the source and drain electrodes as a guidance for designing a semiconductor device according to the present embodiment.

We claim:

1. A semiconductor device comprising:
    a main substrate including a semiconductor substrate, a compound semiconductor layer, which is formed on said semiconductor substrate and having a composition different from said semiconductor substrate, and an interfacial conductive layer formed in a hetero junction interface between said semiconductor substrate and said compound semiconductor layer; and
    a transistor element formed on said main substrate; wherein:
    equations (1) and/or (2) below are satisfied:

$$1\ \mu m \leq X \leq T \quad (1)$$

$$1\ \mu m \leq Y \leq T \quad (2)$$

where X and Y are lengths of portions of source and drain electrodes of said transistor element which are in contact with said compound semiconductor layer along a running direction of carriers respectively, and T is a shortest distance from said source and drain electrodes to said interfacial conductor layer.

2. A semiconductor device according to claim 1, wherein said semiconductor substrate is a silicon substrate, and said compound semiconductor layer is a GaAs layer.

3. A semiconductor device according to claim 1 wherein said compound semiconductor layer includes a plurality of compound semiconductor layers deposited one on another.

4. A semiconductor device according to claim 2, wherein said compound semiconductor layer includes a plurality of compound semiconductor layers deposited one on another.

5. A semiconductor device comprising:
a main substrate including a first semiconductor layer, a second semiconductor layer deposited on said first semiconductor layer and a conductive layer generated by diffusion of atoms included in said first semiconductor layer, as impurities into a second semiconductor side of an interface between said first and second semiconductor layers;
an element formed on said main substrate and having electrodes, wiring and bonding pads; and
a high-resistance region having higher resistance than said conductive layer and being formed on said first semiconductor layer for dividing a first portion including at least one of the electrodes, the wiring and the bonding pads of said element from a second portion including the other of the electrodes, the wiring and the bonding pads of said element, thereby isolating said conductive layer between the first and second portions.

6. A semiconductor device comprising:
a main substrate including a first semiconductor layer, a second semiconductor layer deposited on said first semiconductor layer and a conductive layer generated by diffusion of atoms included in said first semiconductor layer, as impurities into a second semiconductor side of an interface between said first and second semiconductor layers;
a plurality of elements formed on said main substrate and having electrodes, wiring and bonding pads; and
a high resistance region having higher resistance than said conductive layer and being formed on said first semiconductor layer for dividing a first portion including at least two of the adjacent electrodes, the wiring and the bonding pads of said plurality of elements, which are electrically connected to each other and have the same potential, from a second portion including the other of the electrodes, the wiring and the bonding pads of said plurality of elements, thereby isolating said conductive layer between the first and second portions.

7. A semiconductor device according to claim 5, wherein said element is a field-effect transistor; and
said at least one of the electrodes, the wiring and the bonding pads are a gate electrode, wiring for the gate electrode and a bonding pad for the gate electrode.

8. A semiconductor device according to claim 6, wherein said plurality of elements are field-effect transistors; and
said at least adjacent two of the electrodes, the wiring and the bonding pads are gate electrodes, wiring for the gate electrodes and bonding pads for the gate electrodes.

9. A semiconductor device comprising:
a silicon substrate;
at least one compound semiconductor layer formed on said silicon substrate and including a GaAs semiconductor layer for serving as source/drain regions of at least one field-effect transistor (FET);
an insulating layer selectively formed on said at least one compound semiconductor layer; and
first, second and third electrodes, each having a first portion formed on said GaAs semiconductor layer, and serving as one of gate/source/drain electrodes, respectively, of said at least one FET, at least one of said first, second and third electrodes having a second portion formed on said insulating layer; and
wherein the second portion of said at least one of said first, second and third electrodes serves as a bonding pad.

10. A semiconductor device comprising:
a silicon substrate;
at least one compound semiconductor layer formed on said silicon substrate and including a GaAs semiconductor layer for serving as source/drain regions of at least one field-effect transistor (FET);
an insulating layer selectively formed on said at least one compound semiconductor layer; and
first, second and third electrodes, each having a first portion formed on said GaAs semiconductor layer, and serving as one of gate/source/drain electrodes, respectively, of said at least one FET, at least one of said first, second and third electrodes having a second portion formed on said insulating layer; and
wherein each of said first, second and third electrodes has the second portion formed on said insulating layer.

11. A semiconductor device according to claim 5, wherein said high-resistance region is formed by removing at least a portion of said second semiconductor layer which is in contact with said first semiconductor layer.

12. A semiconductor device according to claim 6, wherein said high-resistance region is formed by removing at least a portion of said second semiconductor layer which is in contact with said first semiconductor layer.

13. A semiconductor device according to claim 7, wherein said high-resistance region is formed by removing at least a portion of said second semiconductor layer which is in contact with said first semiconductor layer.

14. A semiconductor device according to claim 5, wherein said high-resistance region is formed by ion injection of impurities.

15. A semiconductor device according to claim 6, wherein said high-resistance region is formed by ion injection of impurities.

16. A semiconductor device according to claim 7, wherein said high-resistance region is formed by ion injection of impurities.

17. A semiconductor device according to claim 5, wherein said high-resistance region includes an insulting film formed on said first semiconductor layer.

18. A semiconductor device according to claim 6, wherein said high-resistance region includes an insulating film formed on said first semiconductor layer.

19. A semiconductor device according to claim 7, wherein said high-resistance region includes an insulating film formed on said first semiconductor layer.

20. A semiconductor device according to claim 5, wherein said first semiconductor layer is a silicon substrate and said second semiconductor layer is a GaAs layer.

21. A semiconductor device according to claim 6, wherein said first semiconductor layer is a silicon substrate and said second semiconductor layer is a GaAs layer.

22. A semiconductor device according to claim 7, wherein said first semiconductor layer is a silicon substrate and said second semiconductor layer is a GaAs layer.

23. A semiconductor device according to claim 11, wherein said first semiconductor layer is a silicon substrate and said second semiconductor layer is a GaAs layer.

24. A semiconductor device according to claim 14, wherein said first semiconductor layer is a silicon substrate and said second semiconductor layer is a GaAs layer.

25. A semiconductor device according to claim 17, wherein said first semiconductor layer is a silicon substrate and said second semiconductor layer is a GaAs layer.

* * * * *